(12) United States Patent
Dwivedi et al.

(10) Patent No.: US 9,404,966 B2
(45) Date of Patent: Aug. 2, 2016

(54) PERFORMANCE CHARACTERISTIC MONITORING CIRCUIT AND METHOD

(75) Inventors: Sandeep Dwivedi, New Thippasandra (IN); Betina Hold, El Dorado Hills, CA (US)

(73) Assignee: ARM Limited, Cambridge (GB)

( * ) Notice: Subject to any disclaimer, the term of this patent is extended or adjusted under 35 U.S.C. 154(b) by 1055 days.

(21) Appl. No.: 13/548,238

(22) Filed: Jul. 13, 2012

(65) Prior Publication Data

US 2014/0015562 A1  Jan. 16, 2014

(51) Int. Cl.
*G01R 31/02* (2006.01)
*G01R 31/317* (2006.01)
*G11C 29/02* (2006.01)
*G11C 7/08* (2006.01)
*G11C 7/12* (2006.01)
*G11C 7/22* (2006.01)
*G11C 29/04* (2006.01)

(52) U.S. Cl.
CPC .... *G01R 31/31718* (2013.01); *G01R 31/31725* (2013.01); *G11C 7/08* (2013.01); *G11C 7/12* (2013.01); *G11C 7/22* (2013.01); *G11C 29/023* (2013.01); *G11C 29/028* (2013.01); *G11C 2029/0409* (2013.01)

(58) Field of Classification Search
CPC ............. G01R 31/31718; G01R 31/31725; G01R 31/31937; G11C 7/08; G11C 7/12; G11C 7/22; G11C 29/023; G11C 29/028
USPC ............................ 324/750.01, 762.02, 762.03
See application file for complete search history.

(56) References Cited

U.S. PATENT DOCUMENTS

| | | | | |
|---|---|---|---|---|
| 2001/0043102 A1* | 11/2001 | Kuge | ........................ | G06F 1/10 327/161 |
| 2011/0216608 A1* | 9/2011 | Hold | ........................ | G11C 7/00 365/189.14 |
| 2013/0002274 A1* | 1/2013 | Saneyoshi | .......... | G01R 31/2849 324/750.01 |

FOREIGN PATENT DOCUMENTS

WO  WO 2011/122365  * 10/2011

OTHER PUBLICATIONS

Ima Bun, Y., Gate-controlled mos variable capacitors, Elect. Eng. Jpn., 93: 123-128, 1973.*

(Continued)

*Primary Examiner* — Daniel Miller
(74) *Attorney, Agent, or Firm* — Pramudji Law Group PLLC; Ari Pramudji

(57) ABSTRACT

A performance characteristic monitoring circuitry includes a first delay circuitry providing a first delay path, where transmission of a data value over that first delay path incurs a first delay that varies in dependence on the performance characteristic. Reference delay circuitry is also included to provide a reference delay path, where transmission of the data value over the reference delay path incurs a reference delay. The reference delay circuitry includes components configured to provide a capacitive loading on the reference delay path in order to produce a self-compensating effect on the reference delay that causes the reference delay to be less sensitive than the first delay to variation in the performance characteristic. Comparison circuitry is then used to generate the output signal of the monitoring circuitry in dependence on a comparison of the first delay and the reference delay.

26 Claims, 15 Drawing Sheets

(56) References Cited

OTHER PUBLICATIONS

Ghosh et al., "On-Chip Process Variation Detection using Slew-Rate Monitoring Circuit", 21$^{st}$ International Conference on VLSI Design, *IEEE Computer Society*, 2008, pp. 143-147.

Melikyan et al., "A Process Variation Detection Method", *IEEE*, 2010, 4 pages.

Khan et al., "Techniques for On-Chip Process Voltage and Temperature Detection and Compensation", *Freescale Semiconductor India Pvt. Ltd.*, (No Date), 6 pages.

Ito et al., "Stochastic TDC Architecture with Self-Calibration", *IEEE*, 2010, pp. 1027-1030.

Jovanovic et al., "Vernier's Delay Line Time-to-Digital Converter", *Ser. A. Appl. Math. Inform. and Mech.*, vol. 1, 1, 2009, pp. 11-20.

\* cited by examiner

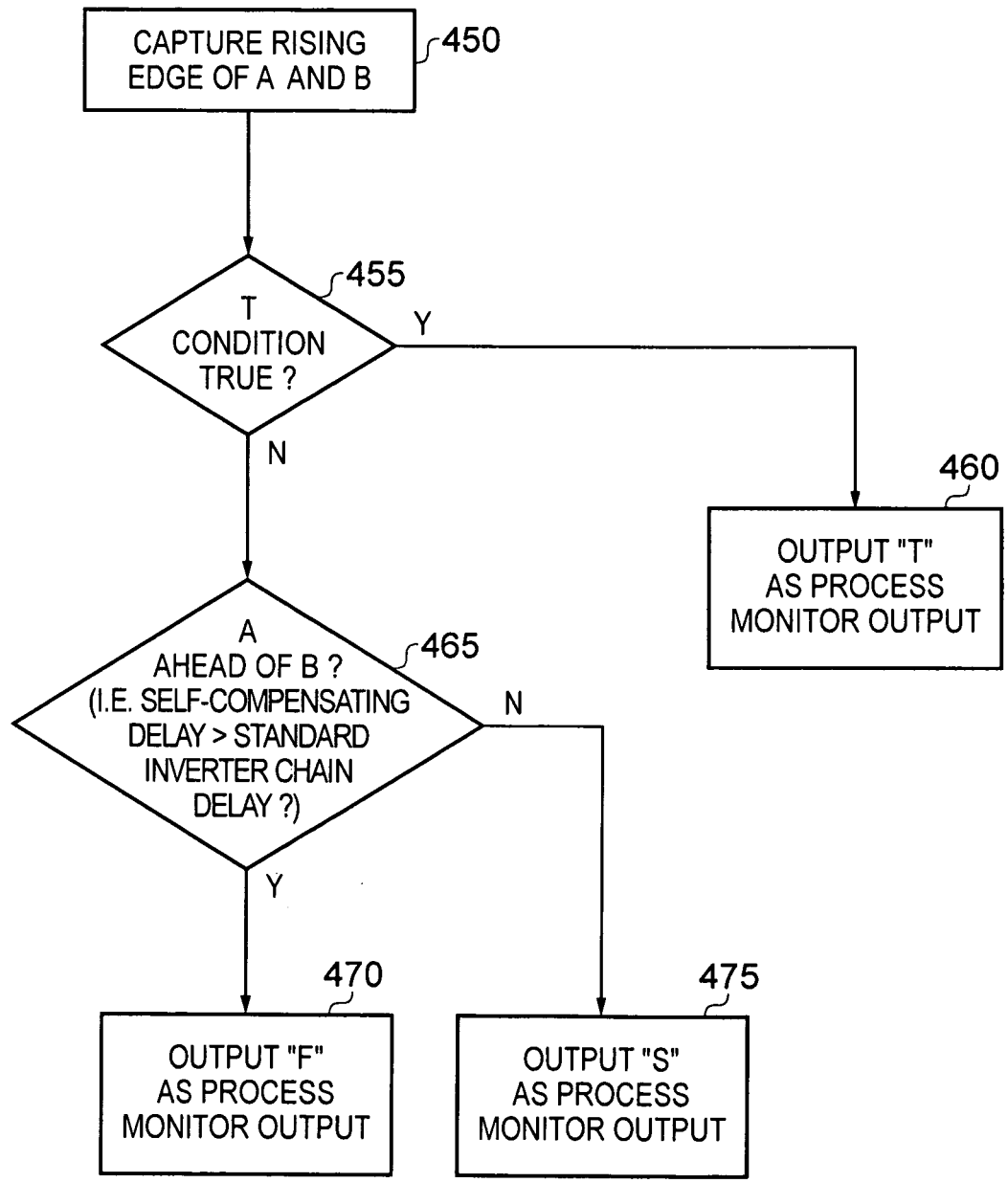
FIG. 7 (operation of fig 6A)

OUT 1 = output from fig 2 delay chain   OUT 2 = output from fig 3 delay chain   OUT 3 = output from fig 8 delay chain

PERFORMANCE CHARACTERISTIC MONITORING CIRCUIT AND METHOD

BACKGROUND OF THE INVENTION

1. Field of the Invention

The present invention relates to a monitoring circuit and method for provision within a device such as an integrated circuit in order to monitor a performance characteristic of components of that device, in situations where the performance characteristic is dependent on one or more physical properties of the components.

2. Description of the Prior Art

When an integrated circuit, such as a memory circuit, is designed, various performance parameters of that integrated circuit typically need to be selected by the designer. In the case of memory circuits, the designers use various margining methodologies during the design stage to set parameters such as, for example, the timing of the sense amplifiers. As process technologies scale to smaller geometries, the variations between different instances of an integrated circuit become greater such that in order to ensure correct operation of worst-case bit cells and the like across the full range of process-voltage-temperature (PVT) parameters, these design margins are becoming increasingly large and impose a performance constraining limitation upon the integrated circuit, even if that particular integrated circuit would in fact be capable of much higher performance. These large margins to deal with increasing process variation result in a loss of frequency performance, increased power consumption and/or other performance reductions.

Process variation is an example of a performance characteristic that is dependent on one or more physical properties of the components within a device. For example, variations in doping concentrations may give rise to variations in performance. As mentioned above, these process variations increase as process technology scales to smaller geometries. It is known to categorise the process variations using so-called process corners. One naming convention for process corners is to use two-letter designators, where the first letter refers to the N-channel MOSFET (NMOS) corner, and the second letter refers to the P-channel MOSFET (PMOS) corner. In this naming convention, three corners exist, namely typical (T), fast (F) and slow (S) corners. Fast and slow corners exhibit carrier mobilities that are higher and lower than normal, respectively. For example, a corner designated as FS denotes fast NFETS and slow PFETS.

If the process corner applicable to a particular instance of a device could be detected in situ, it would allow a reduction in the margins that were required. However, the known techniques for seeking to detect process variation suffer from a number of disadvantages, as will be discussed below.

The article "On-Chip Process Variation Detection Using Slew-Rate Monitoring Circuit" by A Ghosh et al, 21st International Conference on VLSI Design, IEEE 2008, uses a slew rate monitor to detect process. The slew rate monitor circuit uses two comparators with different reference voltages, such that the comparators then switch at different times dependent on the slew. The slew is then used as a metric along with delay to determine the mismatch between the drive strength of NMOS and PMOS devices. However, this circuit is very sensitive to comparator offset, and also its accuracy is dependent on various analog components. Due to the dependency of the circuit on analog components, the overall accuracy of the circuit may be limited. The analog nature of the circuit is also likely to cause issues across various process geometries, since generally analog circuits do not behave the same way as those process geometries change. Such an approach is hence likely to be too complex, inaccurate, and lacking in scalability across different technologies.

The article "A Process Variation Detection Method" by V Melikyan et al, IEEE 2010, also uses an analog circuit to detect process variation and accordingly suffers from similar disadvantages to those outlined above.

The article "Techniques for On-Chip Process Voltage and Temperature Detection Compensation" by Q Khan et al, describes a number of techniques for on-chip PVT detection and compensation. Two circuits are discussed, the first providing delay locked loop (DLL) based PVT compensation, and the second providing ring oscillator based PVT compensation. Whilst the techniques described in this article use a more digital approach than that in the preceding two articles, the circuits used are relatively complex. Whilst the technique described allows for accurate detection of the process, the overhead is likely to make it an impractical solution for many situations, for example in memory devices where overhead is a key concern.

Accordingly, it would be desirable to provide a simple and accurate mechanism for detecting variation in a performance characteristic such as process variation, which is more readily scalable across process technologies.

SUMMARY OF THE INVENTION

Viewed from a first aspect, the present invention provides monitoring circuitry for provision within a device to generate an output signal indicative of a performance characteristic of components of said device, the performance characteristic being dependent on one or more physical properties of said components, the monitoring circuitry comprising: first delay circuitry providing a first delay path, transmission of a data value over said first delay path incurring a first delay that varies in dependence on said performance characteristic; reference delay circuitry providing a reference delay path, transmission of said data value over said reference delay path incurring a reference delay, the reference delay circuitry comprising components configured to provide a capacitive loading on the reference delay path in order to produce a self-compensating effect on the reference delay that causes said reference delay to be less sensitive than said first delay to variation in said performance characteristic; and comparison circuitry configured to generate said output signal in dependence on a comparison of the first delay and the reference delay.

The present invention exploits the use of capacitive loading within a delay chain, the reference delay circuitry being configured such that faster components will see the capacitive loading effect faster whilst slower components will see the capacitive loading effect more slowly. As a result, the capacitive loading introduces a self-compensating effect such that the variation in signal propagation timing between a reference delay path constructed of fast logic components and the same reference delay path constructed from slow logic components is reduced when compared with an equivalent reference delay path without such capacitive loading.

In accordance with the present invention, first delay circuitry is provided that does not have capacitive loading, whilst in addition reference delay circuitry is provided which does have such capacitive loading. The delay in signal propagation over the first delay path of the first delay circuitry and over the reference delay path of the reference delay circuitry is then compared in order to generate an output signal indicative of the performance characteristic of components of the device in which the monitoring circuitry is incorporated. Due to the self-compensating effect of the capacitive loading within the reference delay path, then if the delay of signal propagation through the first delay path is less than the delay of signal propagation through the reference lay path, this will indicate that the performance characteristic of the components is "fast", whereas conversely if the delay through the first delay path is greater than the delay through the reference delay path, this will indicate that the performance characteristic of the components is "slow".

In one embodiment, the comparison circuitry can be arranged such that a certain range of variation in delay between the first delay path and the reference delay path will still result in the performance characteristic being categorised as "typical" (also referred to herein as normal).

The technique of the present invention provides a very simple mechanism for monitoring the performance characteristic of components within a device, allowing for a low cost and low area solution which makes its adoption practical in a variety of different devices. Further, the solution is scalable across process technologies, which further increases the usability of the present invention when compared with the known prior art techniques. In addition it provides a level of accuracy that is sufficient for many applications.

There are a number of ways in which the reference delay circuitry can be configured to provide the capacitive loading on the reference delay path. In one embodiment, the reference delay circuitry comprises a plurality of capacitor loading units, each capacitor loading unit being connected between an associated node of the reference delay path and a reference voltage in order to provide said capacitive loading on the reference delay path. Hence, in accordance with this embodiment, multiple capacitor loading units are placed in parallel between the reference delay path and a reference voltage, and the number of capacitor loading units can be selected to control the degree of self-compensation provided. In one example where the reference delay path comprises a series of inverters, a capacitor loading unit can be associated with each node separating adjacent inverters, or alternatively a capacitor loading unit may be connected to only a subset of the nodes such that multiple inverters appear in the reference delay path between each capacitor loading unit.

Each capacitor loading unit can be constructed in a variety of ways. However, in one embodiment each capacitor loading unit comprises a capacitor element and a coupling element connected in series between the reference voltage and the associated node, the coupling element being configured to control an amount of capacitance present at the associated node due to the capacitor element, said amount of capacitance being controlled so as to introduce a timing effect into said reference delay path that at least partially compensates for a timing variation introduced by variation in said performance characteristic. In this embodiment, the coupling element controls the amount of capacitance so that the amount of capacitance increases as the performance characteristic of the components increases. Hence, the timing effect serves to relatively decrease the speed of signal transmission when the reference delay path is constructed of fast components, and serves to relatively increase the speed of signal propagation when the reference delay path is constructed of slow components.

There are a number of ways in which the coupling element can be constructed to control the capacitance in the manner outlined above. However, in one embodiment the coupling element provides a resistance which reduces as said performance characteristic increases, such that the amount of capacitance present at the associated node increases as the performance characteristic increases. By providing a resistance which varies in this manner, it can be seen that the amount of capacitance present at the associated node can be controlled appropriately so as to increase the capacitance as the performance characteristic increases and decrease the capacitance as the performance characteristic decreases.

One suitable way for arranging the coupling element to provide the desired resistance is to form the coupling element as a transistor configured to receive a voltage at its gate sufficient to at least partially turn the transistor on. When the transistor is turned on, its resistance will vary dependent on the performance characteristic, and in particular the resistance will be less as the performance characteristic increases. Assuming the performance characteristic of the coupling element transistor tracks with the performance characteristic of the components (e.g. the inverters) within the reference delay path, then the capacitive loading on the reference delay path will vary dependent on the performance characteristic so as to produce the desired self-compensating effect.

In one embodiment, rather than providing a voltage at the gate of each coupling element transistor sufficient to turn that transistor fully on, bias circuitry can be used to generate a bias voltage at the gate of the transistor that only partially turns the transistor on. This will mean that the resistance of the transistor is greater, whilst still varying with the performance characteristic, and this can enable the number of capacitor loading units (and hence the length of the delay chain) required to achieve the desired self-compensating effect to be reduced. In addition, use of bias circuitry allows the monitoring circuitry to be tuned post manufacture if required, by variation of the bias voltage. This is in addition to tuning that can take place in some embodiments at margin time (i.e. simulation time), where tuning of capacitor sizes, and/or pass gate sizes (i.e. resistor weighting factors) can take place depending on the size of the delay chain.

As an alternative to providing the reference delay circuitry with a plurality of capacitor loading units as discussed above, the reference delay circuitry may instead comprise a plurality of resistor-capacitor blocks for providing said capacitive loading, each resistor-capacitor block comprising a resistor element within the reference delay path and an associated capacitor element coupled between the resistor element and a reference voltage. Such resistor-capacitor (RC) blocks will inherently provide a propagation delay that varies less with the performance characteristic than is the case for logic components such as inverters, and hence the use of such RC blocks provides a capacitive loading producing the required self-compensating effect. Nevertheless, even when such RC blocks are used, the reference delay circuitry will typically including a number of inverter elements at regular intervals to amplify the signal being propagated along the reference delay path, and to capture that signal at the start and end of the reference delay path. Hence, in one embodiment, the reference delay circuitry further comprises at least an inverter element forming an input element of the reference delay path and an inverter element forming an output element of the reference delay path.

The first delay circuitry can be constructed in a variety of ways, but in one embodiment comprises a series of inverters.

The capacitor elements whose capacitance is used to provide the capacitive loading within the reference delay circuitry can take a variety of forms. However, in one embodiment, each capacitor element is constructed either as a MOS capacitance or an NMOS in NWELL capacitance. By constructing the capacitance in such a way, the capacitance remains fairly constant across the variation in the performance characteristic, and hence provides a suitable form of capacitance for use in the above described embodiments.

In one embodiment, the size of the capacitor elements used to provide the capacitive loading is variable, hence allowing the extent of the self-compensating effect to be varied as required dependent on implementation. It has been found that the effects of varying the capacitance are not linear, since adding capacitance does incur a delay overhead which may not be desirable in certain implementations, such as where the monitoring is being used within a memory device. Hence, whilst the capacitance may be increased to increase the self-compensating effect, it will generally need to kept small enough that it does not introduce too significant a delay overhead.

There are a number of ways of configuring the comparison circuitry in order to produce an output signal in dependence on a comparison of the first delay and the reference delay. In one embodiment the comparison circuitry comprises time to digital converter circuitry configured to measure and compare arrival times of said data value at the output of said first delay circuitry and said reference delay circuitry. However, in an alternative embodiment, a simple phase detector circuit may be used to measure a difference in phase between the data value as received via the first delay path and the data value as received via the reference delay path.

When using either of the above forms of comparison circuitry, it is assumed that the data value is input to both the first delay circuitry and the reference delay circuitry at the same time, and accordingly it is sufficient to analyse arrival times of the data value at the output of the first delay circuitry and the reference delay circuitry. In an alternative embodiment, circuitry could be used to capture the overall transmission time for each delay path and then compare those timings, such that it would no longer then be necessary to initiate the data value transmissions simultaneously in each path. However, such an approach would be likely to increase complexity, and further there is a risk of inaccuracies being introduced due to any differences in PVT conditions between the time of data value transmission by the first delay circuitry and the time of data value transmission via the reference delay circuitry.

The performance characteristic being monitored by the monitoring circuitry can take a variety of forms, but in one embodiment the performance characteristic varies within a range from a fast region to a slow region in dependence on process variations during fabrication of the device affecting one or more physical properties of said components, and the output signal indicates whether said performance characteristic is within said fast region or said slow region. Such a performance characteristic is often referred to as the process characteristic.

In addition to the fast region and slow region, there will also be a normal region within the range of possible values of the performance characteristic, and the comparison circuitry can be adapted to also identify when the performance characteristic is within the normal region. In particular, in one embodiment, the comparison circuitry comprises relative timing circuitry configured, if the first delay and the reference delay differ, to determine which of the first delay and the reference delay is longer, and normal condition detection circuitry configured to determine, if the first delay and the reference delay differ, whether the difference is within a predetermined acceptable range. Output generation circuitry is then configured to cause the output signal to indicate that said performance characteristic is within the normal region if the first delay and the reference delay do not differ, or differ within said predetermined acceptable range.

In one particular embodiment, the output generation circuitry is configured to cause the output signal to indicate that said performance characteristic is within the fast region if the first delay and the reference delay differ by more than said predetermined acceptable region, and the reference delay is greater than the first delay. Further, the output generation circuitry is configured to cause the output signal to indicate that said performance characteristic is within the slow region if the first delay and the reference delay differ by more than said predetermined acceptable region, and the reference delay is smaller than the first delay.

When considering the earlier-mentioned process characteristic, it is sometimes the case that the process characteristic differs between NMOS components and PMOS components, and accordingly it may be desirable to provide indications of the performance characteristic for both NMOS and PMOS components. There are a number of ways in which the monitoring circuitry can be adapted to provide such information. For example, in one embodiment, each coupling element in said plurality of capacitor loading units is constructed such that the timing effect introduced into said reference delay path at least partially compensates for a timing variation introduced by variation in said performance characteristic amongst the NMOS components. The monitoring circuitry then further comprises further reference delay circuitry providing a further reference delay path, transmission of said data value over said further reference delay path incurring a further reference delay. The further reference delay circuitry comprises a plurality of further capacitor loading units, each further capacitor loading unit being connected between an associated node of the further reference delay path and a further reference voltage in order to provide a capacitive loading on the further reference delay path. Each further capacitor loading unit comprises a further capacitor element and a further coupling element connected in series between the further reference voltage and the associated node, the further coupling element being configured to control an amount of capacitance present at the associated node due to the further capacitor element, so as to introduce a timing effect into said further reference delay path that at least partially compensates for a timing variation introduced by variation in said performance characteristic amongst the PMOS components.

In one particular embodiment, the monitoring circuitry further comprises switching circuitry configured, for each data value transmission, to selectively connect one of the reference delay circuitry and the further reference delay circuitry to the comparison circuitry, such that over a sequence of data value transmissions the comparison circuitry obtains comparison results sufficient to cause the output signal generated to provide output data indicative of the performance characteristic for both the NMOS components and the PMOS components.

Accordingly, with such an arrangement, it can be seen that a series of data value transmissions can be performed, including at least one transmission where the comparison circuitry compares the delays incurred by the first delay circuitry and the reference delay circuitry, and at least one further data value transmission where the comparison circuitry compares the delays experienced by the first delay circuitry and the further reference delay circuitry. Based on the comparison results obtained over the series of data value transmissions, the output signal generated can then be arranged to provide output data indicative of the performance characteristic for both the NMOS components and the PMOS components.

As an alternative to the "serial" approach discussed above where the reference delay circuitry and further reference delay circuitry are alternately used during a sequence of data value transmissions, a parallel approach can be adopted where multiple instances of the earlier-described monitoring circuitry are used to form a monitoring system. In particular, viewed from a second aspect, the present invention provides a monitoring system for provision within a device to generate a result signal indicative of a performance characteristic of components of said device, the performance characteristic being dependent on one or more physical properties of said components, the monitoring system comprising: a plurality of instances of monitoring circuitry in accordance with the first aspect of the present invention, each instance configured to generate an associated output signal indicative of said performance characteristic; and evaluation circuitry configured to receive the associated output signals from each of said plurality of instances of monitoring circuitry, and to generate said result signal in dependence on those associated output signals.

In one embodiment, the multiple instances can be used to improve overall accuracy by averaging out for any effect of mismatch in performance characteristic between the components of the first delay circuitry and the components of the reference delay circuitry. In particular, in one embodiment the reference delay circuitry in each instance of monitoring circuitry is identically configured, and the evaluation circuitry is configured to perform an averaging operation in respect of the received associated output signals in order to generate said result signal. For example, if five instances are used, and the majority (but not necessarily all) identify the performance characteristic as "fast", then the monitoring system will choose to identify the performance characteristic as fast.

In an alternative embodiment, the multiple instances can be physically distributed within the device so as to capture how the performance characteristic varies across the device (for example to capture across-chip variation). This information can then be used to control the operation of various portions of the device, dependent on where those portions physically reside, and hence which monitoring circuit's output is to be used to influence that control.

As another alternative, the various instances of the monitoring circuit can be used to provide the above-mentioned NMOS and PMOS specific performance characteristic information. For example, in one embodiment, the reference delay circuitry in at least one instance of monitoring circuitry is configured such that the associated output signal generated is indicative of the performance characteristic of the NMOS components, and the reference delay circuitry in at least one other instance of monitoring circuitry is configured such that the associated output signal generated is indicative of the performance characteristic of the PMOS components. The evaluation circuitry is then configured to combine the associated output signals from each of said plurality of instances of monitoring circuitry in order to generate as said result signal result data indicative of the performance characteristic for both NMOS components and PMOS components.

The monitoring circuitry and monitoring system of the above described embodiments will be useful in a variety of different devices in order to monitor the performance characteristic. However, in one embodiment, the device within which the monitoring circuitry is used is a memory device. In particular, viewed from a third aspect, the present invention provides a memory device comprising: a memory array configured to store data; control circuitry configured to generate a number of control signals used to control access to the memory array; at least one instance of monitoring circuitry in accordance with the first aspect of the present invention, each instance configured to generate an output signal indicative of a performance characteristic of components of said memory device; and the control circuitry being configured to adjust timing of at least one of said control signals in dependence on said output signal.

The output signal generated by the monitoring circuitry can be used within the memory device in a variety of ways. For example, it can be used to alter the operation of self-timed paths so as to increase performance by reducing the memory margining required.

Viewed from a third aspect, the present invention provides a method of monitoring within at device a performance characteristic of components of said device, the performance characteristic being dependent on one or more physical properties of said components, the method comprising: transmitting a data value over a first delay path provided by first delay circuitry, transmission of said data value over said first delay path incurring a first delay that varies in dependence on said performance characteristic; transmitting said date value over a reference delay path provided by reference delay circuitry, transmission of said data value over said reference delay path incurring a reference delay; arranging the reference delay circuitry to contain components providing a capacitive loading on the reference delay path in order to produce a self-compensating effect on the reference delay that causes said reference delay to be less sensitive than said first delay to variation in said performance characteristic; and generating an output signal in dependence on a comparison of the first delay and the reference delay, said output signal providing an indication of said performance characteristic.

Viewed from a fourth aspect, the present invention provides monitoring circuitry for provision within a device to generate an output signal indicative of a performance characteristic of components of said device, the performance characteristic being dependent on one or more physical properties of said components, the monitoring circuitry comprising: first delay means for providing a first delay path means, transmission of a data value over said first delay path means incurring a first delay that varies in dependence on said performance characteristic; reference delay means for providing a reference delay path means, transmission of said data value over said reference delay path means incurring a reference delay, the reference delay means comprising means for providing a capacitive loading on the reference delay path means in order to produce a self-compensating effect on the reference delay that causes said reference delay to be less sensitive than said first delay to variation in said performance characteristic; and comparison means for generating said output signal in dependence on a comparison of the first delay and the reference delay.

BRIEF DESCRIPTION OF THE DRAWINGS

The present invention will be described further, by way of example only, with reference to embodiments thereof as illustrated in the accompanying drawings, in which:

FIG. 7 is a flow diagram illustrating the operation of the comparison circuitry of FIGS. 6A to 6D in accordance with one embodiment;

DESCRIPTION OF EMBODIMENTS

Figure 1:
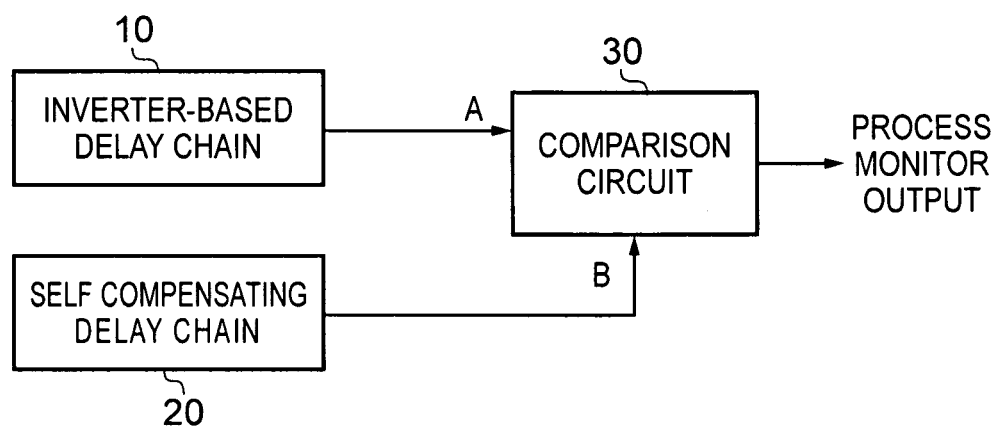
FIG. 1 is a block diagram of monitoring circuitry in accordance with one embodiment.

FIG. 1 is a block diagram of monitoring circuitry in accordance with one embodiment. The inverter-based delay chain 10 provides a first delay path, such that transmission of a data value over that first delay path incurs a first delay that varies in dependence on the process characteristic of components of the device within which the monitoring circuitry of FIG. 1 is used. As is understood by those skilled in the art, the process characteristic may vary over a range including a series of "process corners". When the device is fabricated, certain variations in physical properties of the components will be introduced, for example doping concentrations, which will result in the components having performance characteristics which will either be faster than normal (the F corner), slower than normal (the S corner) or normal (the T or typical corner).

The self-compensating delay chain 20 provides a reference delay path, such that transmission of the data value over the reference delay path incurs a reference delay. However, in contrast to the standard inverter-based delay chain 10, the self-compensating delay chain 20 comprises components that are configured to provide a capacitive loading on the reference delay path in order to produce a self-compensating effect on the reference delay that causes the reference delay to be less sensitive than the first delay to variation in the performance characteristic.

The comparison circuitry 30 can then be used to monitor the delay in the data value transmission via the inverter-based delay chain and the delay in the data value transmission via the self-compensating delay chain in order to decide how to categorise the process characteristic of the components. In one embodiment, data value transmission is initiated simultaneously via the inverter-based delay chain and the self-compensating delay chain, and the comparison circuitry 30 is adapted to monitor the arrival time of that data via both delay chains, and to determine the process characteristic dependent on those relative arrival times. The data value transmission monitored can take a variety of forms, but typically will be occurrence of an event such as a rising edge or a falling edge of a data signal. To obtain a good average, both edges could be evaluated over multiple iterations of the monitoring process so that the characterisation of the process corner takes account of the behaviour of both edges.

Figure 2:
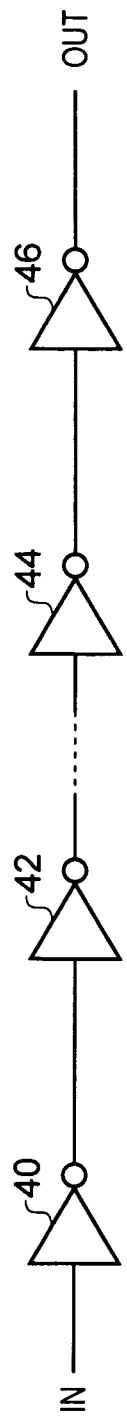
FIG. 2 illustrates components provided within the inverter-based delay chain of FIG. 1 in accordance with one embodiment.

FIG. 2 schematically illustrates components provided within the inverter-based delay chain 10 in one embodiment, where the delay chain 10 merely comprises a series of inverters 40, 42, 44, 46. The threshold voltage and resistance of the components within each inverter will vary dependent on the process characteristic, and this will hence have an effect on the propagation delay over the first delay path provided by the series of inverters 40, 42, 44, 46. In particular, if the components forming each inverter are fast, the inverter will present early switch times and/or less resistance to the delay path, and accordingly the signal will propagate quicker along the delay path. Conversely, if the components are slow, this will present later switch times and/or an increase in the resistance provided by each inverter, and accordingly slow down signal propagation along the delay chain.

Figure 3:
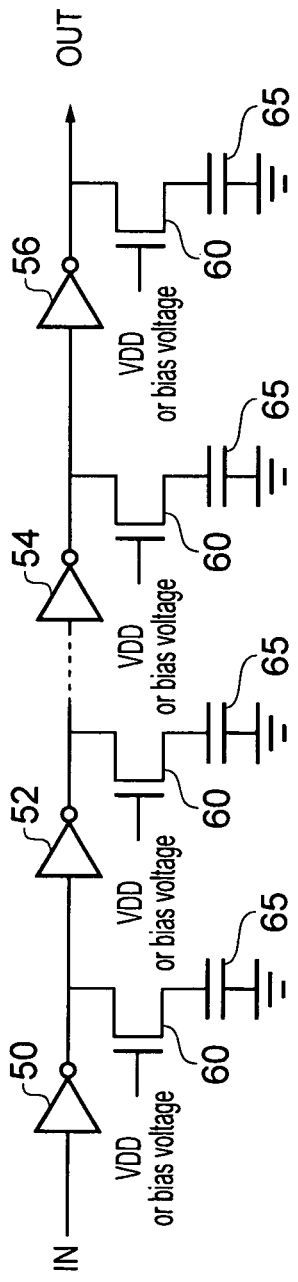
FIG. 3 illustrates components provided within the self-compensating delay chain of FIG. 1 in accordance with one embodiment.

FIG. 3 illustrates components that can be provided within the self-compensating delay chain 20 in accordance with one embodiment. Again, the delay path includes a series of inverters 50, 52, 54, 56. However, a capacitor loading unit formed of a transistor 60 and a capacitor 65 is coupled between selected nodes of the reference delay path and a ground reference potential. A capacitor loading unit can be provided in association with each node separating adjacent inverters, or alternatively such a capacitor loading unit may only be provided for a subset of the nodes, for example one capacitor loading unit every two inverters. This is a matter of design choice, dependent on the length of delay chain, and the desired self-compensating effect.

In this example, the transistors 60 are NMOS transistors, and in one embodiment the gate of those transistors is provided with the supply voltage VDD in order to turn on those transistors. As a result, the capacitor element 65 is placed between the associated node of the reference delay and ground, and accordingly provides a capacitive loading on the associated node. However, each transistor 60 will still provide a resistance in the path between the associated node of the reference delay path and ground, and accordingly the amount of capacitance present (i.e. observed) at the associated node will vary dependent on the resistance of that pass gate transistor 60. In particular, if the transistor 60 has a fast process characteristic, it will have less resistance than a typical transistor, and accordingly a larger proportion of the capacitance will be present at the associated node, hence providing a timing effect that partially offsets the higher signal propagation speed due to the fast inverters 50, 52, 54, 56. Similarly, if the transistor 60 is slow, it will have more resistance, and hence reduce the amount of capacitance observed at the associated node, hence slowing signal propagation down less than would be the case for fast components.

As an alternative to using the supply voltage VDD, a bias voltage can be provided to the gate of each transistor 60, with that voltage being selected so as to only partially turn on the transistors, hence increasing the resistance of the transistors. By such an approach, it is possible to introduce the desired self-compensating effect with a shorter delay chain.

From the above description, it will be seen that the principle of the self-compensating delay chain is that if the resistance of the inverters varies with process, then the capacitance introduced into the delay path via the capacitor 65 will vary in the opposite direction to that resistance, so that delay (T=RC) is subjected to a normalising effect across process variation. Hence, if the devices are "fast", the capacitance will be seen more quickly and thus will have a larger effect on the transition times, thus providing a normalising effect on the delay. The delay chain will effectively spend time charging the capacitors 65 rather than charging the gate of the inverter load. Similarly, if the components are slow, the capacitance will be seen less, and the delay chain will effectively spend less time charging the capacitors and more time charging the gate of the inverter load, hence providing an "effective" faster transition time of the logic.

The length of the inverter chains can be varied dependent on implementation, but in general terms the inverter chain should be long enough so that the time differential built up between the self-compensating delay chain 20 and the standard inverter-based delay chain 10 is sufficient enough for accurate detection by the comparison circuitry, and any process mismatch between the two delay chains 10, 20 is normalised.

Figure 4:
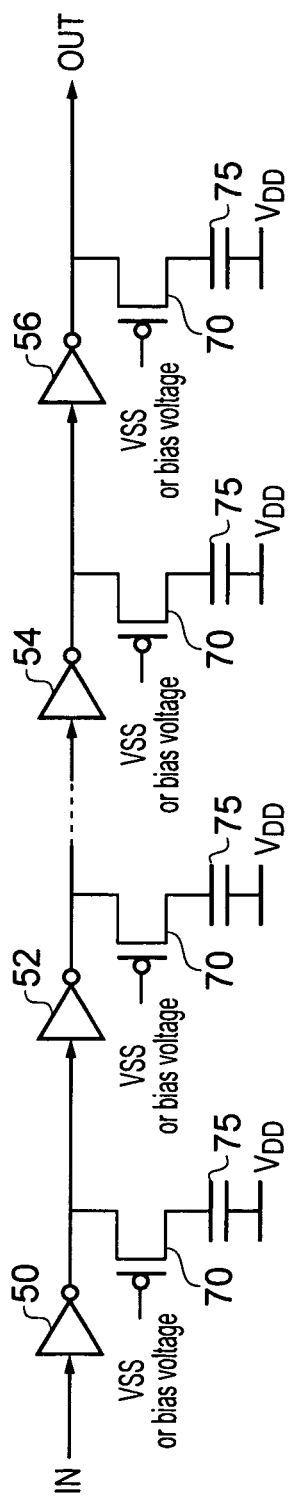
FIG. 4 illustrates components provided within the self-compensating delay chain of FIG. 1 in accordance with an alternative embodiment.

FIG. 4 illustrates an alternative embodiment of self-compensating delay chain, where each capacitor loading unit is formed of a PMOS transistor 70 and a capacitor 75 connected in series between the associated node of the reference delay path and the VDD supply potential. Due to the use of PMOS transistors, a ground supply potential can be provided to the gate in order to turn those transistors on. Alternatively, in an analogous manner to that described earlier with reference to FIG. 3, a bias voltage can be used to only partially turn on the PMOS transistors if desired.

When using either the FIG. 3 or the FIG. 4 approach, the size of the capacitors 65, 75 can be varied to achieve varying levels of self-compensation. However, as the capacitance increases, this will incur a delay overhead, and hence a balance has to be reached between the amount of self-compensating effect to be introduced by each capacitor and the associated delay overhead. In one embodiment, the number of capacitor loading units, the size of the capacitors of those capacitor loading units, and the voltage used to turn on the transistors of those capacitor loading units, can all be tuned having regard to the desired amount of self-compensation to be achieved.

Figure 5A:
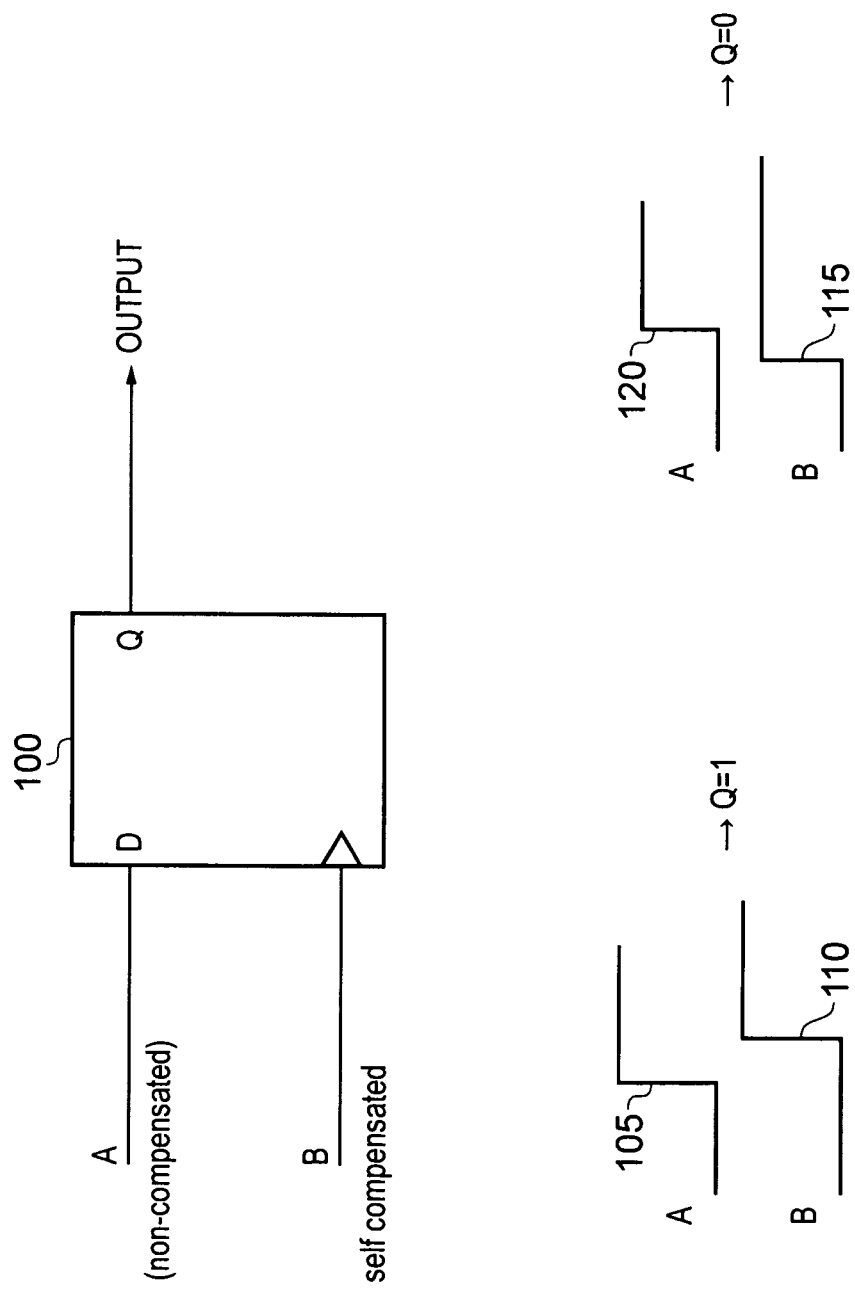
FIG. 5A illustrates the comparison circuitry of FIG. 1 in accordance with one embodiment.

FIG. 5A illustrates a form of the comparison circuitry 30 in accordance with one embodiment, where a phase detector in the form of a flip-flop 100 is used. In this example, it is assumed that the presence of the data value at the output of each delay circuit will be observed by a rising edge of the signal on that delay path. The signal output from the self-compensating delay circuitry (referred to herein as signal B) is provided to the clock input of the flip-flop 100, whilst the signal from the standard inverter-based delay chain 10 (referred to herein as the signal A) is provided to the data input of the flip-flop 100. Accordingly, when a rising edge appears in the signal B, this is used to sample the data input (i.e. the value of the signal A at that time). Accordingly, if the delay through the inverter-based delay chain 10 is less than the delay through the self-compensating delay chain, then the signal A will undergo a rising edge 105 ahead of the signal B, and accordingly by the time the rising edge 110 occurs in the signal B, the signal A will already be at a logic one value, and accordingly the output signal Q will be set equal to one. This will indicate that the components are fast components since the self-compensating delay was greater than the standard delay and hence the standard inverter-based delay chain 10 is constructed of fast components. Similarly, if the delay in the inverter-based delay chain 10 is longer than the delay in the sell-compensating delay chain, then a rising edge 115 in the signal B will occur before a rising edge 120 in the signal A. Accordingly, at the sampling point, the signal A will still be at a logic zero level, and accordingly Q will be set equal to zero, this identifying that the components are slow components.

If the data value transmitted down both delay paths takes the form of a clock-style signal, the frequency of oscillation will need to be set low enough that the relative delay between the two signals cannot differ by more than half a clock cycle, since this could cause an incorrect output Q value. For example, if the signal B was more than half a cycle later than the signal A, this could cause the Q value to be set equal to zero when in fact it should be set equal to one. However, this requirement can readily be achieved through appropriate constraining of the design of the inverter-based delay chain 10 and the self-compensating delay chain 20.

Figure 5B:
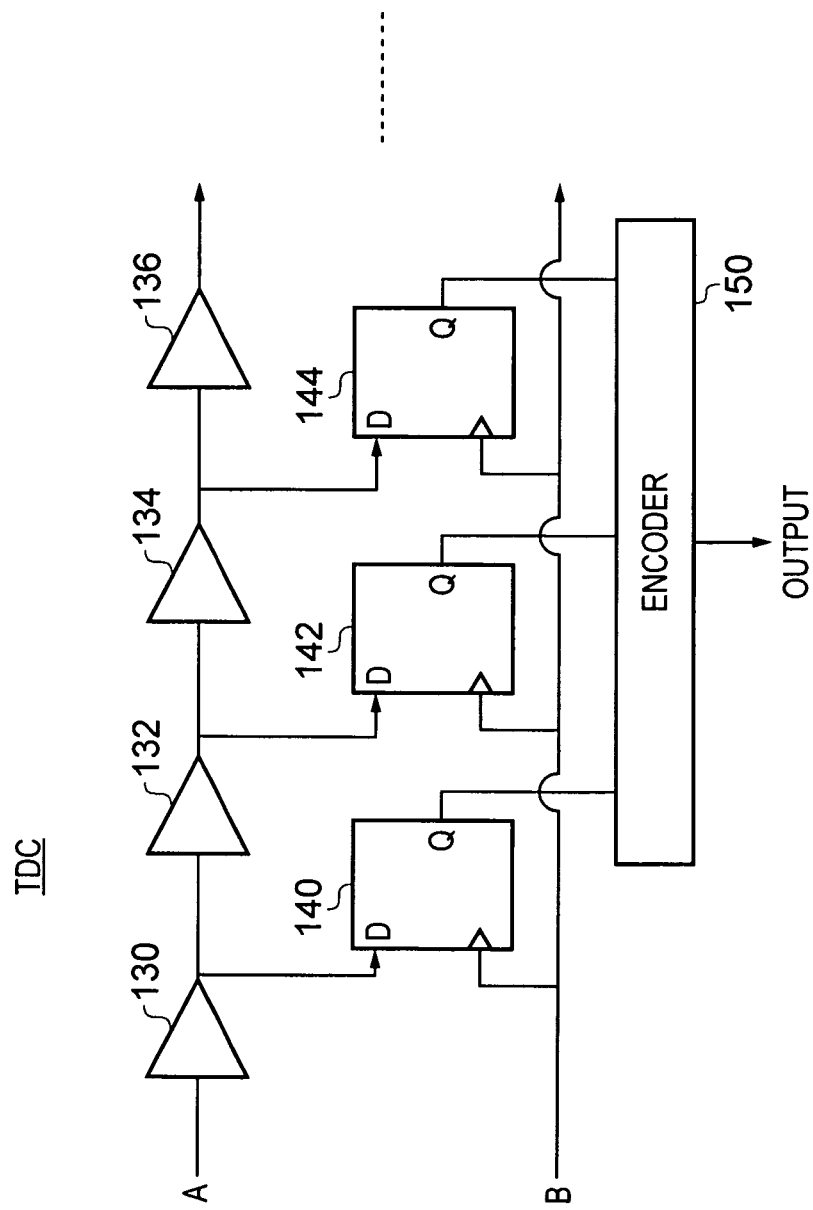
FIG. 5B illustrates the comparison circuitry of FIG. 1 in accordance with an alternative embodiment.

As an alternative to using a phase detector as shown in FIG. 5A, a time-to-digital-converter (TDC) circuit can be used, such as for example illustrated in FIG. 5B. A TDC measures the time interval between two edges, and time resolution of several picoseconds can be achieved when the TDC is implemented with an advanced CMOS process. TDC circuits are described for example in the article "Stochastic TDC Architecture with Self-Calibration" by S Ito et al, IEEE 2010, and the article "Vernier's Delay Line Time-to-Digital Converter" by G Jovanović et al, Scientific Publications of the State University of Novi Pazar, Scr. A: Appl. Math. Inform. And Mech. Vol. 1, 1 (2009), pages 11-20. FIG. 5B shows the configuration of a basic TDC circuit. The output A from the inverter-based delay chain 10 passes through a buffer delay chain formed of the buffer elements 130, 132, 134, 136 (in one embodiment these buffers can be inverters) and the delayed output from respective buffer elements is used as the data input for a series of flip-flops 140, 142, 144. The output B from the self-compensating delay chain 20 is used as the clock input of those flip-flops (although not shown in FIG. 5B the propagation path for the output B may also include buffer elements, but they will introduce less delay than the corresponding buffer elements in the propagation path for the output A). The output signals from each flip-flop are then passed to an encoder 150 which produces an output in the form of a binary code whose value is dependent on the interval between the rising edge of signal A and the rising edge of signal B (the resolution being determined by the delay of each buffer element). Considering the example where the event being propagated is a rising edge, then if the rising edge of signal A is after the rising edge of signal B, the binary code will be all zeros, whereas if the rising edge of signal A is ahead of the rising edge of signal B the binary code will be non-zero.

Whilst circuits such as those shown in FIGS. 5A and 5B can be used to distinguish between fast and slow process characteristics, by comparing the arrival time of signals from the standard inverter-based delay chain 10 and from the self-compensating delay chain 20, they cannot in themselves identify the normal (i.e. typical) range. If it is desired to identify the characteristic as either fast, slow or typical, rather than just fast or slow, then in one embodiment the comparison circuitry of FIG. 6A can be used. In this example, the comparison circuitry 30' uses a TDC or phase detector 200 which can take the form of the circuits discussed earlier in FIGS. 5A and 5B. However, in addition, the signals A and B from the inverter-based delay 10 and self-compensating delay chain 20, respectively, are also provided as an input to the normal condition detector 210, which is configured to identify when the relative timing between the signals A and B is within a normal range. A true/false normal condition signal is then output dependent on the evaluation performed by the normal condition detector 210, which is used to control the operation of the output generation circuitry 220. In particular, the output generation circuitry 220 will use the fast/slow indication from the TDC or phase detector 200 if the output from the normal condition detector 210 indicates that the normal condition is not present. Otherwise, the output generation circuitry 220 will generate an output signal indicating the presence of the normal condition.

Figure 6A:
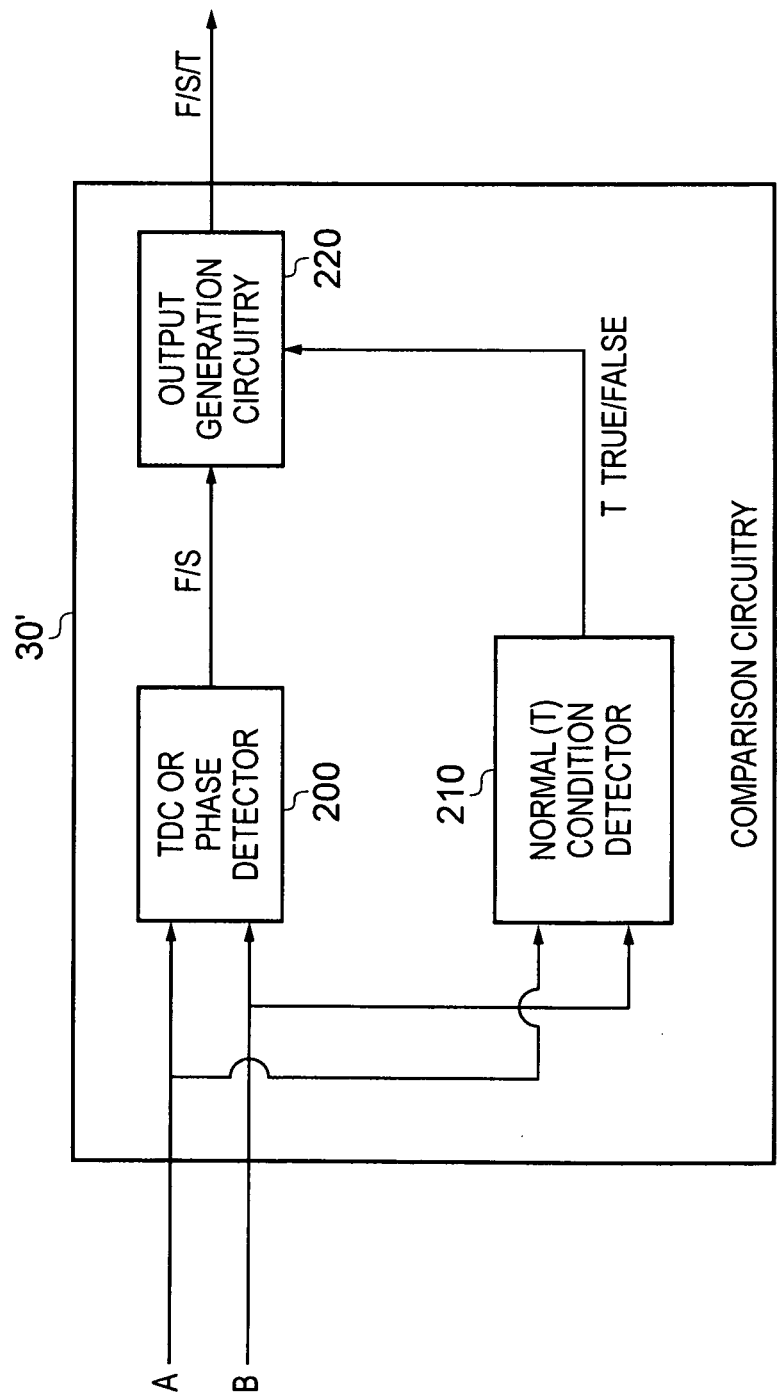
FIGS. 6A to 6D illustrate the comparison circuitry of FIG. 1 in accordance with a yet further embodiment.
Figure 6B:
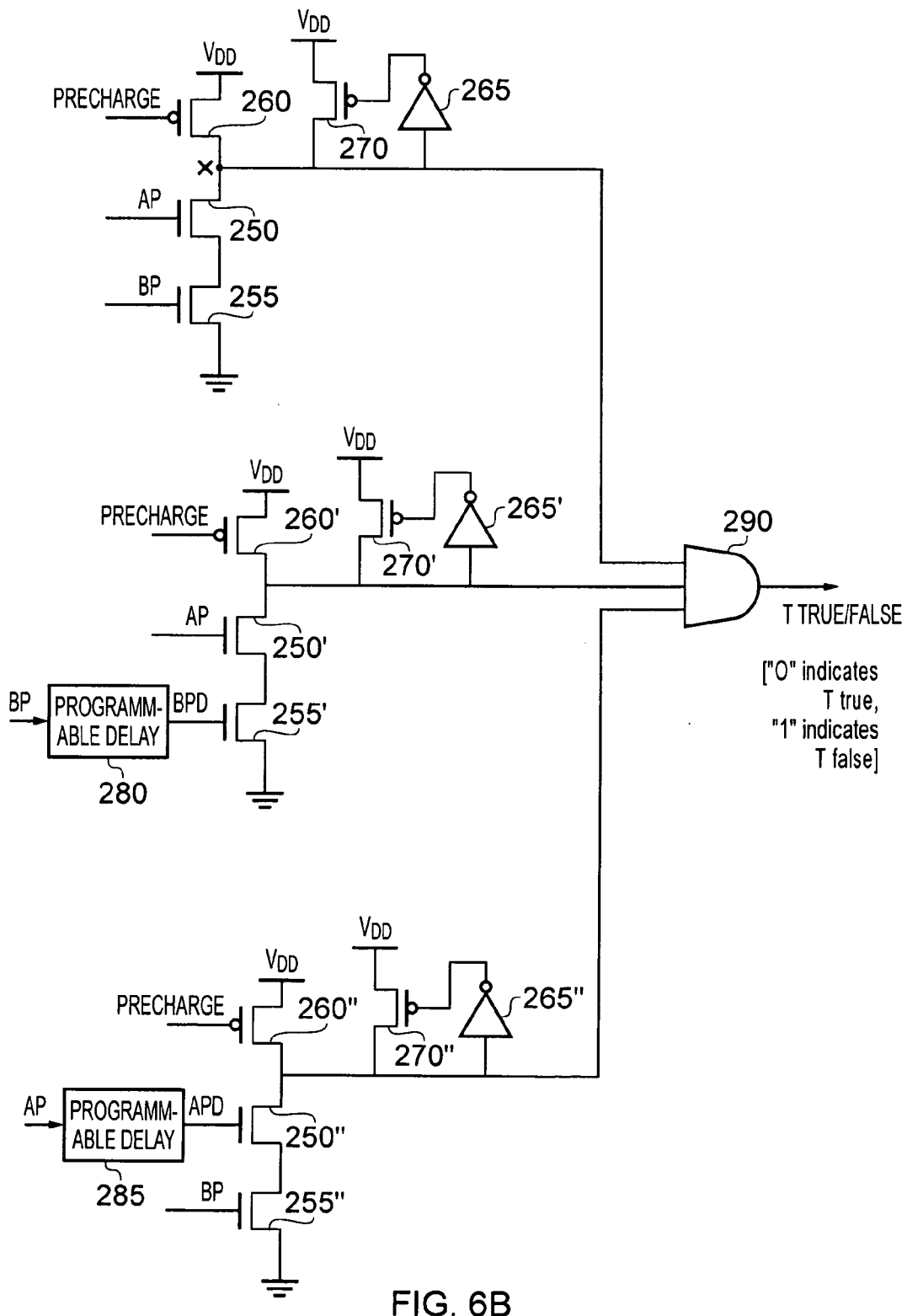
Figure 6C:
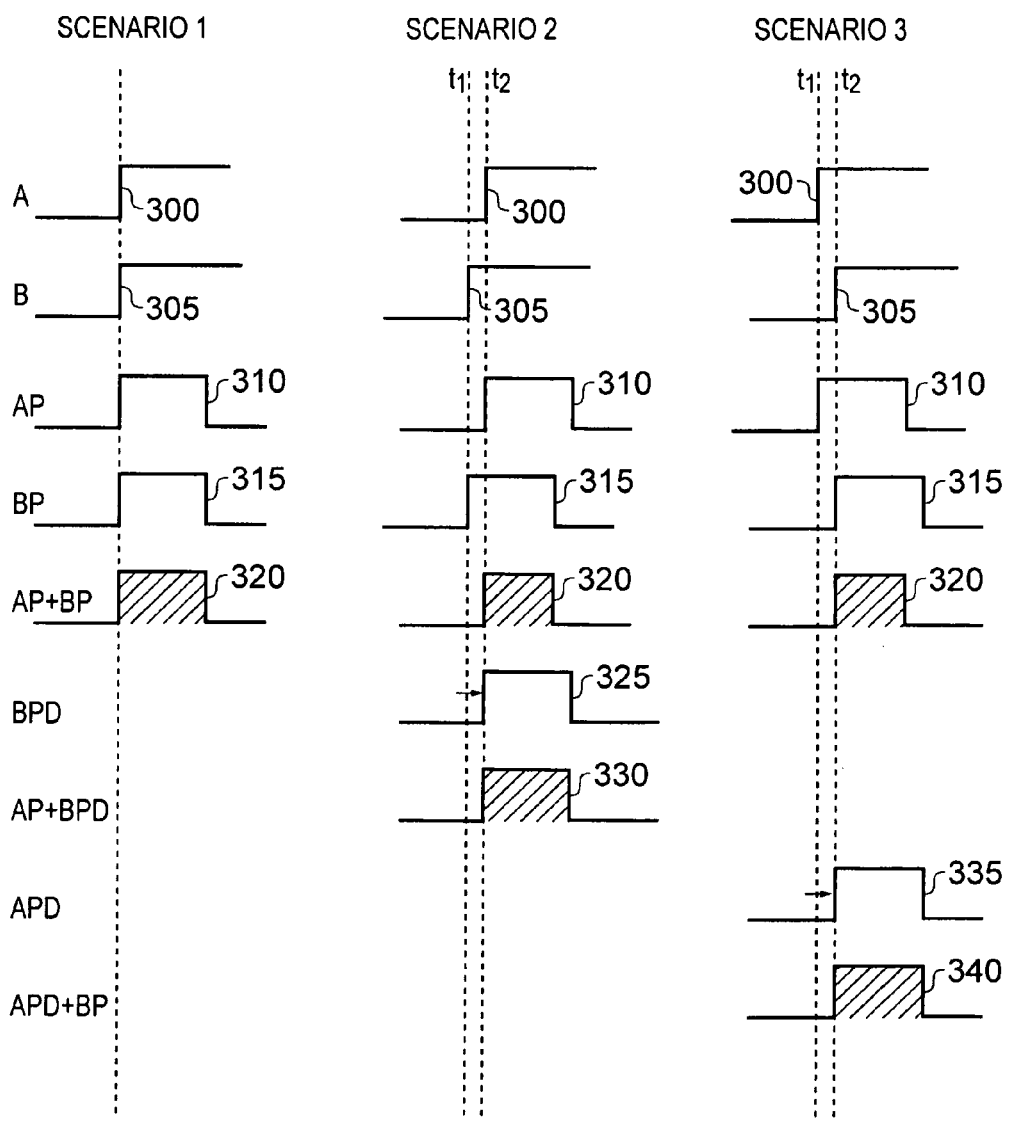

The normal condition detector 210 in one embodiment takes the form illustrated in FIG. 6B. The various signals input to FIG. 6B are illustrated in FIG. 6C. Considering the top portion of the figure, a PMOS transistor 260 is used to precharge a node X to the supply voltage VDD. Following the precharge operation, that node X is selectively discharged dependent on whether the two NMOS transistors 250, 255 are turned on. The transistor 250 receives at its gate a pulse signal AP 310 which is generated off the rising edge of the signal A 300. Similarly, the NMOS transistor 255 receives at its gate a pulse signal BP 315 generated off the rising edge of the signal B 305. The time during which both transistors 250 and 255 are on simultaneously is hence given by the pulse 320 shown in FIG. 6C. If that pulse is long enough, it will cause the voltage on node X to discharge to a level sufficient to flip the output of the inverter 265, and hence turn the PMOS transistor 270 off. If this happens, then a logic zero will be input to the corresponding input of the AND gate 290, causing the true/false indicator to drop to a logic zero level, indicating that the normal condition has been detected.

Clearly as the arrival time between the signals A and B starts to vary, the size of the pulse 320 will reduce and hence a point will quickly be reached where the node X will not discharge enough to flip the output of the inverter 265, and accordingly the output from the AND gate will stay at a logic one value.

To accommodate a larger range of normal condition, the circuit in the upper part of FIG. 6B can be replicated three times, but with the input provided to the various NMOS transistors varied as shown.

In particular, if we consider scenario two in FIG. 6C, and the middle portion of circuitry in FIG. 6B, when the signal B is ahead of the signal A, a programmable delay 280 can be used to effectively delay the BP pulse 315 in order to give rise to the pulse BPD 325. When the pulse BPD is then used as an input to the gate of the NMOS transistor 255', rather than the pulse 320, it will be seen that the resultant time during which both transistors 250' and 255' are turned on (see pulse 330) will be sufficient to cause the output of the inverter 265' to flip and accordingly cause the PMOS transistor 270' to turn off. As a result, a logic zero value will be provided to the AND gate 290 even if the output from the upper circuitry of FIG. 6B stays at a logic one value, and accordingly will allow an extension of the range of variation detected as a typical condition.

The lower circuitry in FIG. 6B operates in an identical manner, but in respect of scenario three of FIG. 6C where the signal A is ahead of the signal B. In this case the pulse AP 310 is delayed to form the pulse APD 335, by use of the programmable delay 285, and accordingly the width of the pulse APD+BP 340 will dictate whether an input to the inverter 265" reduces to a level sufficient to flip the output of that inverter and hence turn off the PMOS transistor 270".

Figure 6D:
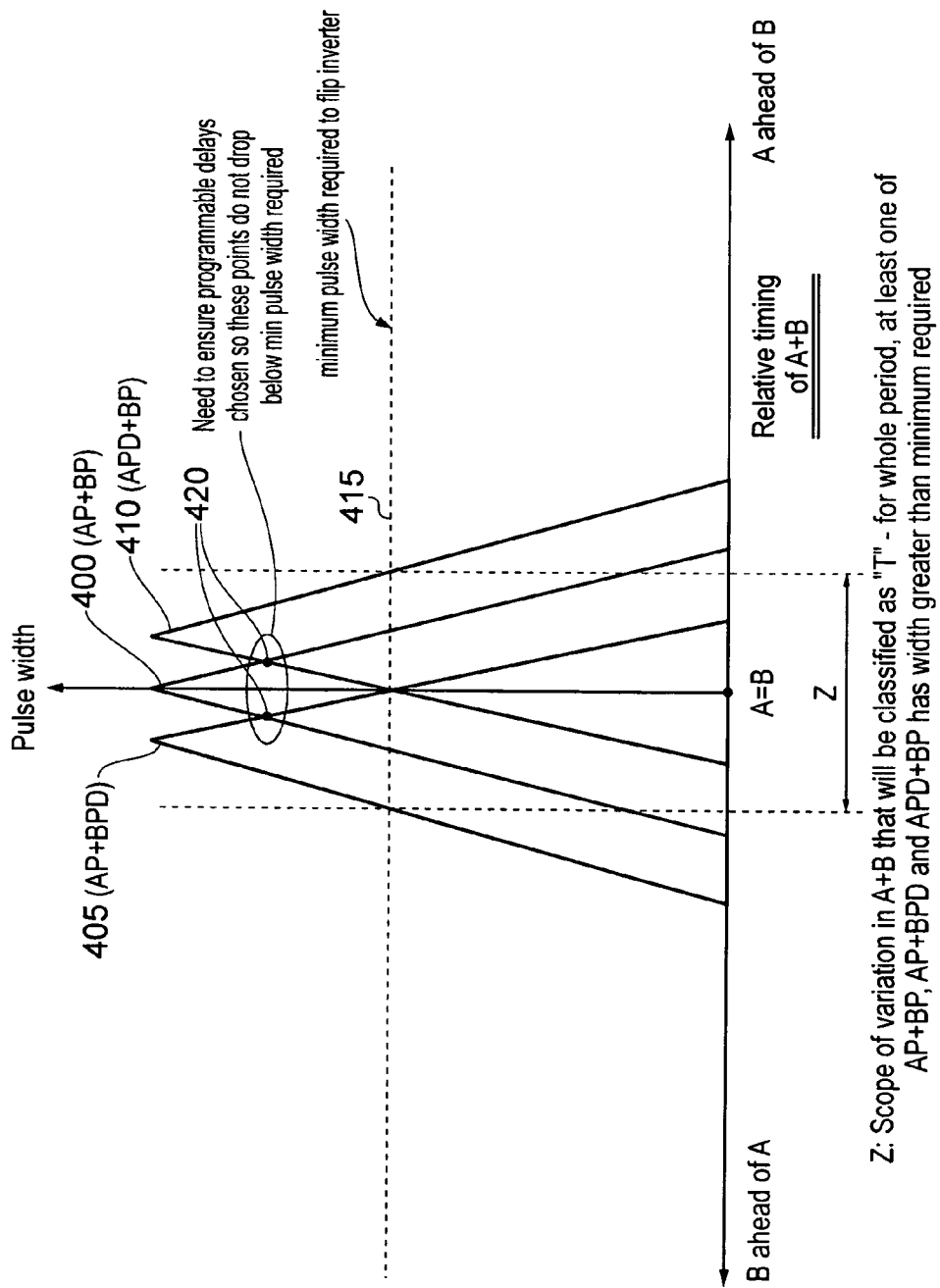

FIG. 6D schematically illustrates the effect of the use of the circuitry of FIG. 6B. In essence, three different pulse widths 400, 405, 410 arise indicative of the duration of time in the three circuit portions shown in FIG. 6B where the input to the associated inverter is discharging. The horizontal line 415 illustrates the minimum pulse width which is required to flip the corresponding inverter, and by virtue of the three different pulses 400, 405, 410, it can be seen that this gives rise to a range Z indicating the amount of variation in arrival time between the signals A and B that will be classified as the typical condition rather than as representative of the fast or the slow condition. The programmable delay introduced by the components 280, 285 can be varied dependent on implementation, provided that it is ensured that the two troughs 420 do not drop below the minimum pulse width level 415.

From the above description of embodiments of the monitoring circuitry, it can be seen that such embodiments provide a simple mechanism for detecting process corners with the required degree of accuracy for many applications. In one embodiment, the delay chains 10, 20 are merely characterized/tuned for the TT process corner (i.e. the delay chains are matched so that at the TT corner they are aligned), and then any process deviation will be captured by the comparison circuitry 30 of the monitoring circuitry. Hence, in such embodiments, all corners are simulated to verify functionality, but matching is only performed at the TT corner for the delay chains, and the amount of variation from the TT corner is centralized in the design and simulation of the comparison circuitry within the monitoring circuitry.

FIG. 7 is a flow diagram schematically illustrating the operation of the comparison circuitry of FIG. 6A in accordance with one embodiment. At step 450, the rising edge of signals A and B are captured by both the phase detector 200 and the normal condition detector 210. At step 455, the normal condition detector 210 then determines whether the normal (i.e. T) condition is true, and if so the process branches to step 460, where the true signal from the normal condition detector 210 causes the output generation circuitry 220 to output as the process monitor output an indication that the process is typical (T).

However, if at step 455, it is determined that the T condition is not true, then the false signal output by the normal condition detector 210 causes the output generation circuitry 220 to use the output from the TDC or phase detector 200 in order to determine the output of the process monitor. In particular, at step 465, the TDC or phase detector 200 will determine whether signal A is ahead of signal B, i.e. whether the self-compensating delay is greater than the standard inverter chain delay. If it is, then this will cause the output generation circuitry 220 to output that the process characteristic is fast (F). If at step 465 it is instead determined that the signal B is ahead of signal A, then the process proceeds to step 475, where the output generation circuitry 220 identifies the process as slow (S). Whilst FIG. 7 is by its nature shown as a sequential series of steps, it will be appreciated that steps 455 and step 465 can actually be evaluated in parallel using the normal condition detector 210 and TDC or phase detector 200, respectively.

Figure 8A:
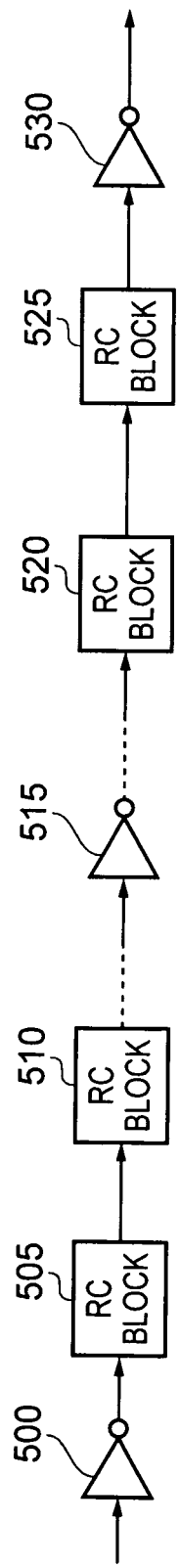
FIGS. 8A and 8B illustrate components provided within the self-compensating delay chain in accordance with a yet further embodiment.
Figure 8B:
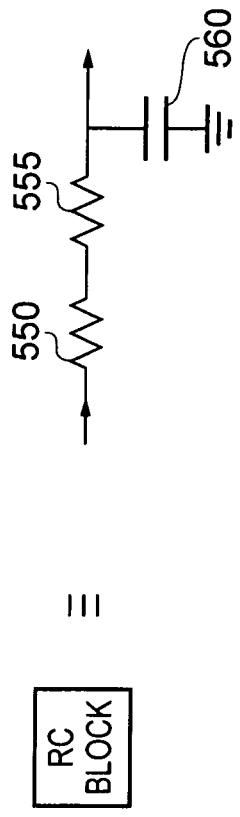

FIGS. 8A and 8B illustrate an alternative arrangement for the self-compensating delay chain 20 of FIG. 1 in accordance with one embodiment. As shown in FIG. 8A, the self-compensating delay chain of this embodiment includes a series of RC blocks 505, 510, 520, 525. As shown in FIG. 5B, each RC block is formed of one or more resistor elements 550, 555 placed in series within the delay path, and a capacitor 560 coupled between the delay path and a reference potential, in this example the reference potential being a ground potential. The inverters 500, 530 are used to capture the data value being transmitted at both the start and the end of the delay chain. In addition, one or more further inverters 515 may be provided along the length of the delay chain in order to amplify the signals propagated along the delay chain path. The RC blocks will by their nature vary less with process variation than logic components such as the inverters 500, 515, 530, and hence a self-compensating delay chain constructed in such a manner will be less sensitive than the standard inverter-based delay chain to variation in the process characteristic.

Figure 9:
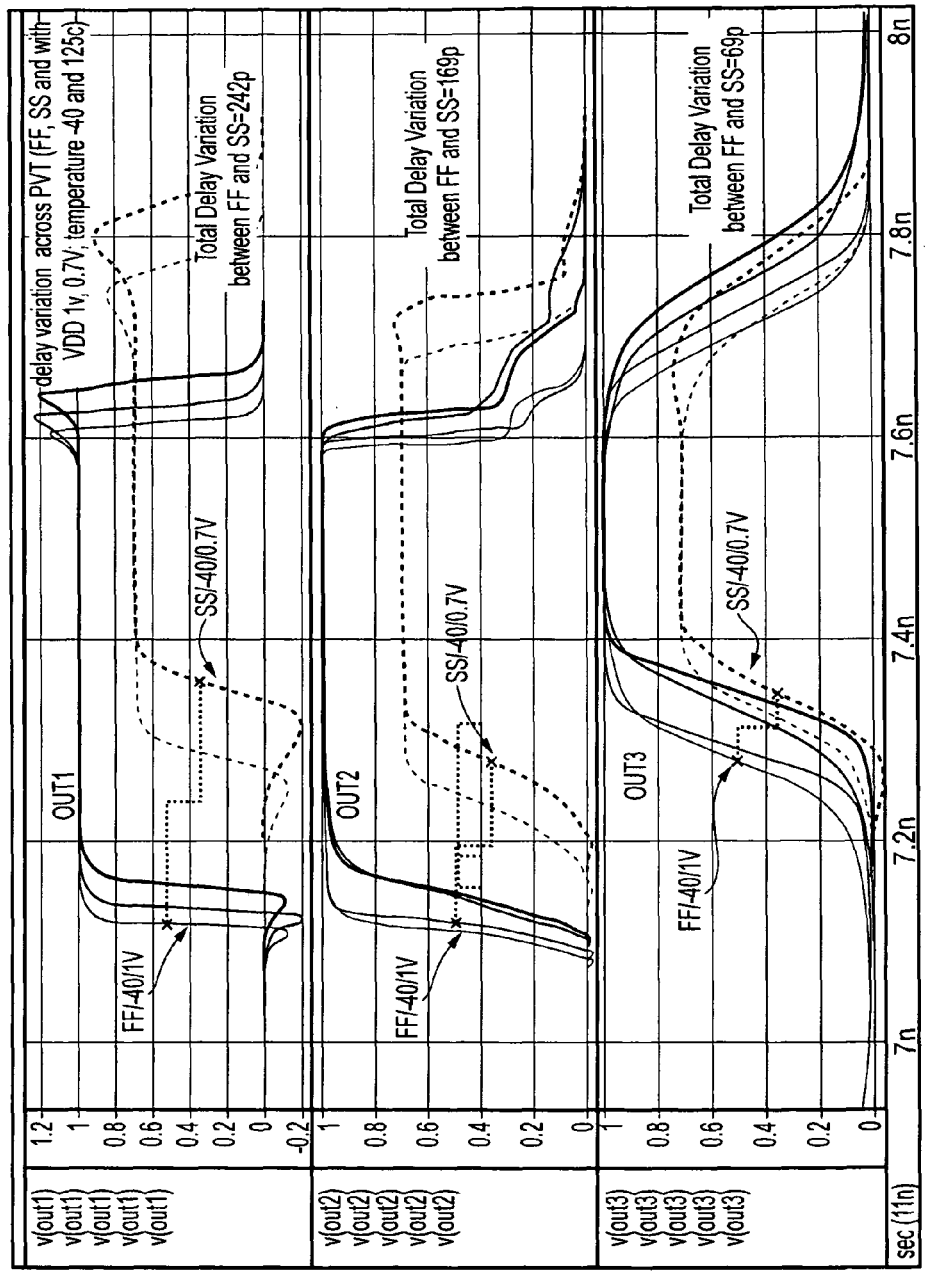
FIG. 9 provides simulation results illustrating the delays observed when using the delay chains of FIGS. 2, 3 and 8A, respectively.

FIG. 9 provides some simulation results for various delay chain circuits. In particular, the upper graph shows as "OUT1" the output from the standard inverter-based delay chain of FIG. 2, the middle graph shows as "OUT2" the output from the self-compensating delay chain of FIG. 3, and the lower graph shows as "OUT3" the output from the self-compensating delay chain of FIGS. 8A and 8B. The various graphs show the timing difference between the FF (fast NMOS and fast PMOS) and SS (slow NMOS and slow PMOS) process corners. As can be seen from the figures, both of the self-compensating delay chains exhibit less variation between these two corners. However, whilst "OUT3" offers the closest correlation between the FF and SS corners, it comes at the price of an increased delay, and for this reason it is more likely that an arrangement of self-compensating delay chain such as that shown in FIG. 3 (or indeed FIG. 4) will be more preferable in many scenarios, since the overall delays are comparable to those through the inverter-based delay chain 10, and the self-compensating effect is sufficient to enable the fast and slow corners to be detected by comparison of the output of that circuitry with the output of the standard inverter based delay chain. Further, the amount of self-compensating effect introduced, can, as discussed earlier, be tuned by determining the number of capacitor loading units to add to the delay chain, the size of the capacitors within those capacitor loading units, and the voltage applied to the gates of the transistors within each capacitor loading unit.

Whilst the monitoring circuitry of FIG. 1 allows the fast and slow process corners to be detected, and indeed allows the components to be classified as typical rather than fast or slow, for example if the circuitry of FIGS. 6A to 6D is used, further steps are required if it is desired to distinguish between the process characteristic of NMOS components and PMOS components. In one embodiment, this can be achieved by using multiple instances of the monitoring circuitry in parallel to form a monitoring system as for example shown in FIG. 10. Here, a first instance of the monitoring circuitry is formed by the inverter-based delay chain 600, a self-compensating delay chain 605 constructed in accordance with FIG. 3, and comparison circuitry 610. A second instance of the circuitry consists of a standard inverter-based delay chain 615, a self-compensating delay chain 620 constructed as in FIG. 4, and comparison circuitry 625. Evaluation circuitry 630 is arranged to receive the output from each of the comparison circuits 610, 625, and based thereon to generate a consolidated output. Additional instances of the FIG. 1 design could also be added to FIG. 10 (each extra instance using either the FIG. 3 delay chain or the FIG. 4 delay chain) in order to add some redundancy into the design.

If the comparison circuits 610, 625 are both constructed as in FIG. 5A or 5B, then both comparison circuits will output a single bit value identifying whether the components are to be classified as fast or slow. The first instance of the monitoring circuitry, using the NMOS-based self-compensating delay chain 605 will hence produce an indication as to whether the NMOS components are fast or slow, whilst similarly the second instance, which uses the PMOS-based self-compensating delay chain 620, will produce an indication as to whether the PMOS components are fast or slow. The evaluation circuitry 630 can then merely produce a consolidated output in accordance with the following lookup table:

TABLE 1

| OUTPUT 1 | OUTPUT 2 | CONSOLIDATED OUTPUT |
|---|---|---|
| 1 | 1 | 11 (SS) |
| 1 | 0 | 10 (SF) |
| 0 | 1 | 01 (FS) |
| 0 | 0 | 00 (FF) |

In this arrangement, it is assumed that a logic zero value indicates a fast condition and a logic one value indicates a slow condition. It will be appreciated that this meaning of the bit values can be readily achieved by modifying the circuitry of FIG. 5A, either by swapping the A and B inputs, or by adding an inverter to the output.

If each comparison circuit 610, 625 instead takes the form shown in FIG. 6A, then the typical condition will also be evaluated, and accordingly the evaluation circuitry can identify any of the following conditions: FF, FS, TT, SS, SF (and FT, TF, ST, TS if desired).

Figure 10:
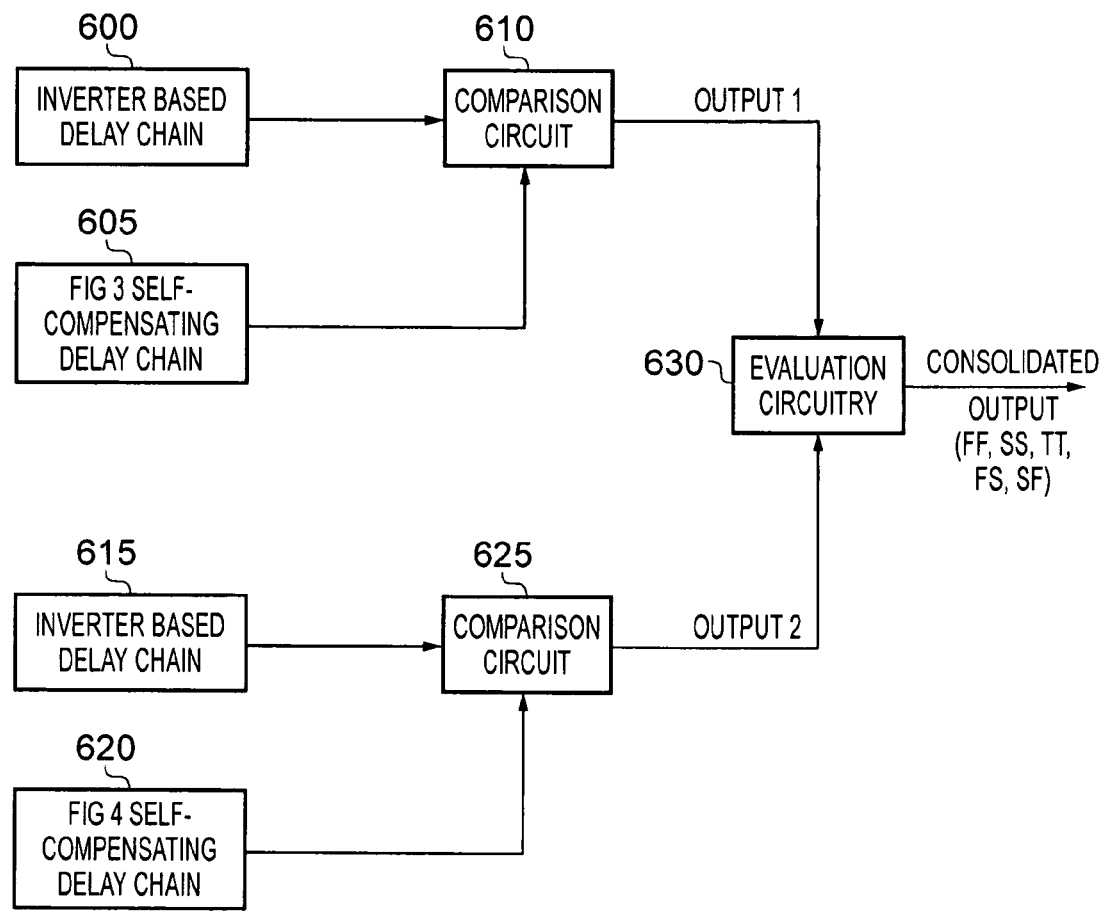
FIG. 10 is a block diagram illustrating a monitoring system in accordance with one embodiment.
Figure 11:
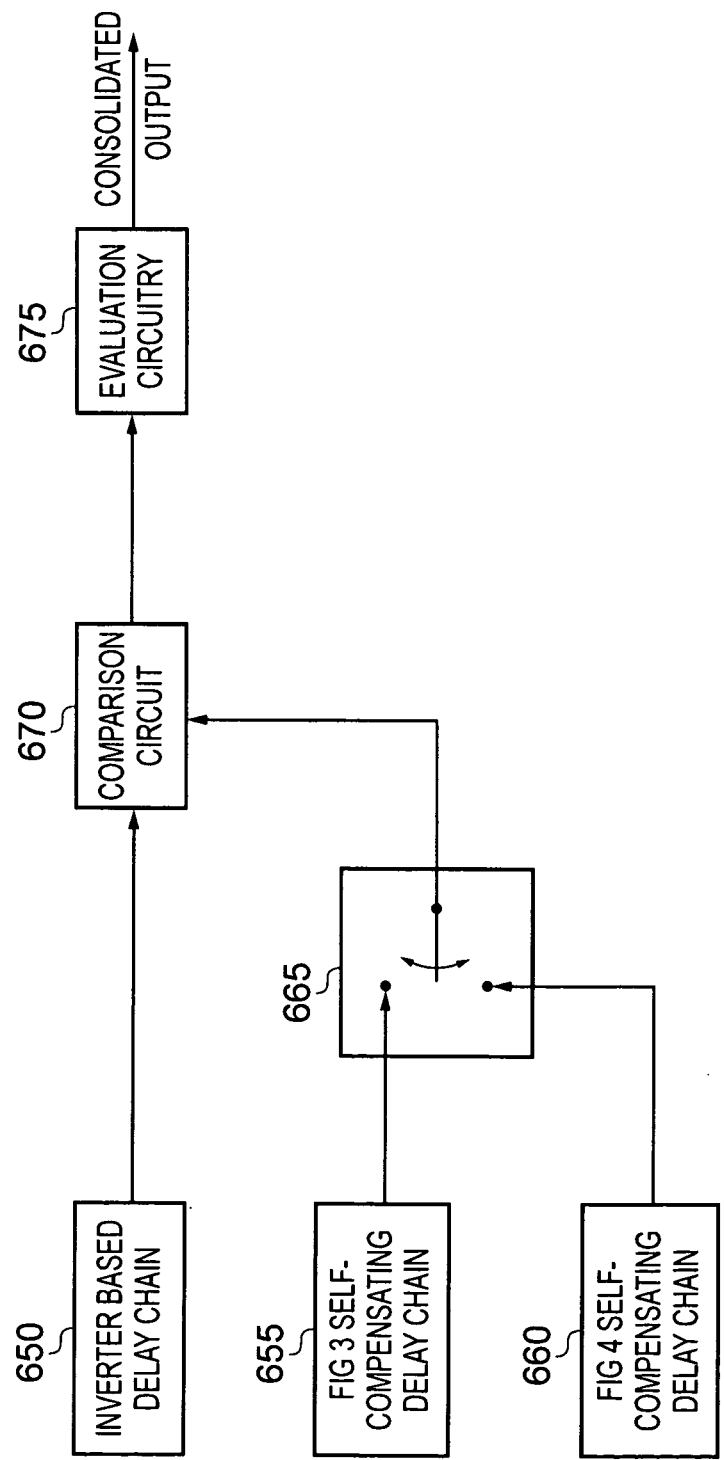
FIG. 11 is a block diagram illustrating monitoring circuitry in accordance with an alternative embodiment.

FIG. 11 illustrates an alternative arrangement, where instead of the parallel approach taken in FIG. 10, a serial approach is taken. In particular, a single instance of monitoring circuitry is provided, but this includes switching circuitry 665 for switching between either a self-compensating delay chain 655 configured as in FIG. 3, or a self-compensating delay chain 660 configured as in FIG. 4. During one iteration of the test, a data value will be passed simultaneously through the inverter-based delay chain 650 and the self-compensating delay chain 655, with the switch 665 coupling the delay chain 655 to the comparison circuit 670. The output from the comparison circuit will then be temporarily stored by the evaluation circuitry 675. In another iteration of the test, a data value will be passed simultaneously through the inverter based delay chain 650 and the self-compensating delay chain 660, with the switch circuitry 665 this time connecting the self-compensating delay chain 660 to the comparison circuit 670. When the result of that iteration is received by the evaluation circuitry 675, it is combined with the output from the previous iteration in order to produce a consolidated output. As with the earlier description of FIG. 10, the comparison circuit 670 can be constructed using the approach discussed earlier with reference to FIG. 5A or 5B, or alternatively may take the more complex form shown in FIG. 6A to allow typical conditions to be evaluated.

The monitoring circuitry of the above described embodiments can be used in a variety of devices where it is desirable to monitor the process characteristic of components within that device. For example, such an approach will be useful in any device where margin has been added to account for the worst case scenario, since it allows some of that margin to be removed given the ability to dynamically ascertain in use which process corner is being exhibited by the components of the device. A particular example use case is within a memory device such us shown schematically in FIG. 12.

Figure 12:
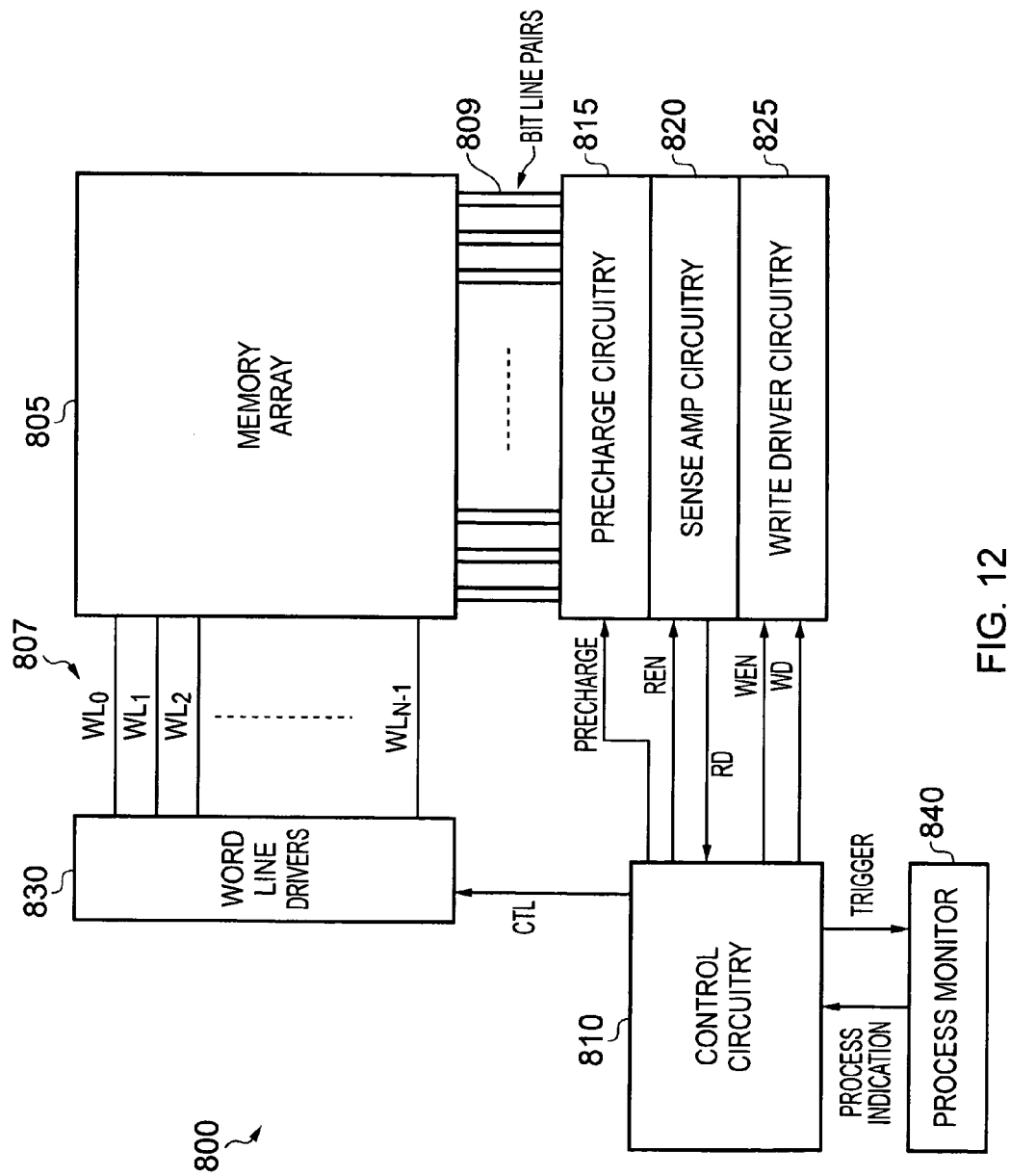
FIG. 12 is a block diagram illustrating a memory device incorporating process monitoring circuitry in accordance with one embodiment.

In particular, FIG. 12 is a block diagram of a memory device including a memory array 805 comprising an array of memory cells arranged in a plurality of rows and columns. A plurality of word lines 807 are provided through the array in order to allow individual rows of memory cells to be addressed by the word line drivers 830. In addition, a plurality of bit line pairs 809 are provided in association with the columns of memory cells. Each column is coupled to an associated bit line pair to enable data to be written into an activated memory cell of the column during a write operation, and for data to be read from an activated memory cell of the column during a read operation.

Precharge circuitry 815 is used to precharge the voltage level on the bit lines 809 under the control of control circuitry 810. Following the precharge operation, a write operation or a read operation can be performed. For a write operation, the control circuitry 810 will issue a control signal to the word line drivers 830 in order to cause a particular row of memory cells to be activated, and the control circuitry 810 will further cause the write driver circuitry 825 to control the voltages on the bit lines 809, in order to cause the required data value to be written into the memory cells of the activated row. For a read operation, again the control circuitry 810 will issue a control signal to the word line drivers 830 in order to cause a particular row of memory cells to be activated, and the sense amplifier circuitry 820 will be triggered under the control of the control circuitry 810 in order to evaluate the voltages on the bit lines 809 following a predetermined read period after which the addressed memory cells have been activated. In particular, during the read operation, the addressed memory cells will selectively discharge one of their associated bit lines, dependent on the data value stored therein, and by evaluating the voltages on those bit lines at a predetermined point in time after the bit lines have begun to be selectively discharged by the addressed memory cells, the sense amplifier circuitry 820 can determine the data held within the addressed memory cells.

In accordance with the illustrated embodiment, a process monitor 840 is provided which can take the form of the monitoring circuitry or monitoring system described earlier herein. In response to a trigger signal from the control circuitry 810, the process monitor 840 can perform a data value transmission (or a series of data value transmissions) through the inverter-based delay chain and self-compensating delay chain in order to output to the control circuitry a process monitor output giving an indication of the process characteristic of the components within the memory device.

One or more instances of the process monitor can be used as desired. For example, at certain process geometries, it may be appropriate to use more than one monitor due to the variation that can occur across different regions of the device. For example, at 40 nm technology, a single process monitor may be sufficient, whilst at 28 nm technology, it may be appropriate to provide a number of distributed process monitors throughout the device in order to allow across device variation to be detected.

Further, the frequency with which the process monitor 840 is triggered can be varied dependent on embodiment. For example, in one embodiment, the control circuitry 810 may be arranged merely to trigger the process monitor once at initialisation time. However, in other embodiments, it may be appropriate to evaluate the process more regularly anti hence to periodically issue the trigger signal to the process monitor throughout the operation of the device.

The process indication provided from the process monitor 840 can be used by the control circuitry 810 to alter the timing of various control signals. Purely by way of example, when memories are margined, self-timed paths are built to trigger certain events. Typically, the SS corner is slower than the FF corner, and in some cases (particularly when the components are operating in the FF corner) a signal may arrive too quickly or a pulse width may be too narrow, resulting in a failure occurring. As a result, the self-timed path (whether it be a replica or a canary circuit) has to be slowed down, and when this is factored into the margining techniques, it will be appreciated that all corners suffer, i.e. the slow ones and the fast ones. However, when a process monitor in accordance with the above-described embodiments is incorporated within the memory device, it is then possible to design a replica path which operates as fast as possible for slow corners, and then for fast corners it can be dynamically adjusted to slow down critical paths only for those fast corners. This hence enables the maximum performance to be achieved at each corner.

In one specific example, the process monitor 840 can hence produce an output which the control circuitry uses to modify sense amplifier timing. However, it can also be used for controlling a variety of other internal memory control signals, for example word line firing, sense amplifier terminating, precharge triggering, word line termination, data latch enabling, etc.

As another example of the use of the process monitor, the process indication can be used to improve handling of pipeline race conditions, whether within a memory device or any other device where a series of sequential and combinational logic is provided. In particular, if a circuit has a series of sequential and combinational logic, it is necessary to design both the setup and hold times so that the flip-flops or latches will operate correctly in all process corners. In order to cater for the SS corner, it is hence necessary to ensure that any very fast race conditions through the latches or combinational logic are not the cause of timing failures. To cater for this scenario, it is typical for the circuits to be slowed down and for buffers to be added as and where required to guarantee timing. However, if instead a process monitor of the earlier described embodiments exists within the device, then the fast corners can be treated specially. As a result, the slow corners will not incur extra margining overhead which slows them down in case there is a fast or race path in a logic area. Hence, as with the earlier example, the circuit is verified under slow corner cases, and where fast corners would otherwise fail, adjustments are made to that circuitry only when the fast process corner is detected, so that slow process corners are not affected.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. Monitoring circuitry for provision within a device to generate an output signal indicative of a performance characteristic of components of said device, the performance characteristic being dependent on one or more physical properties of said components, the monitoring circuitry comprising:

first delay circuitry providing a first delay path, transmission of a data value over said first delay path incurring a first delay that varies in dependence on said performance characteristic;

reference delay circuitry providing a reference delay path, transmission of said data value over said reference delay path incurring a reference delay, the reference delay circuitry comprising components configured to adjust the reference delay to be less sensitive than said first delay to variation in said performance characteristic, wherein adjusting the reference delay is self-compensating and includes providing capacitive loading on the reference delay path; and comparison circuitry configured to generate said output signal in dependence on a comparison of the first delay and the reference delay, wherein the components of reference delay circuitry comprise a plurality of resistor-capacitor blocks for providing said capacitive loading, each resistor-capacitor block comprising a resistor element within the reference delay path and an associated capacitor element coupled between the resistor element and a reference voltage.

2. Monitoring circuitry as claimed in claim 1, wherein the components of the reference delay circuitry further comprise a plurality of capacitor loading units, each capacitor loading unit being connected between an associated node of the reference delay path and a reference voltage in order to provide said capacitive loading on the reference delay path.

3. Monitoring circuitry as claimed in claim 2, wherein each capacitor loading unit comprises a capacitor element and a coupling element connected in series between the reference voltage and the associated node, the coupling element being configured to control an amount of capacitance present at the associated node due to the capacitor element, said amount of capacitance being controlled so as to introduce a timing effect into said reference delay path that at least partially compensates for a timing variation introduced by variation in said performance characteristic.

4. Monitoring circuitry as claimed in claim 3, wherein said coupling element provides a resistance which reduces as said performance characteristic increases, such that the amount of capacitance present at the associated node increases as the performance characteristic increases.

5. Monitoring circuitry as claimed in claim 4, wherein said coupling element comprises a transistor configured to receive a voltage at its gate sufficient to at least partially turn the transistor on.

6. Monitoring circuitry as claimed in claim 5, further comprising bias circuitry configured to generate the voltage provided to the gate of the transistor.

7. Monitoring circuitry as claimed in claim 2, wherein said reference delay path comprises a series of inverters, each inverter having an output node, and at least a subset of the output nodes having one of said capacitor loading units associated therewith.

8. Monitoring circuitry as claimed in claim 6, wherein the bias circuitry provides tuning of the monitoring circuitry based on varying of the generated voltage.

9. Monitoring circuitry as claimed in claim 1, wherein the reference delay circuitry further comprises at least an inverter element forming an input element of the reference delay path and an inverter element forming an output element of the reference delay path.

10. Monitoring circuitry as claimed in claim 1, wherein said first delay circuitry comprises a series of inverters.

11. Monitoring circuitry as claimed in claim 1, wherein each capacitor element is constructed to provide one of a MOS capacitance and an NMOS in NWELL capacitance.

12. Monitoring circuitry as claimed in claim 1, wherein the size of each capacitor element being variable to vary the extent of the self-compensating effect.

13. Monitoring circuitry as claimed in claim 1, wherein said comparison circuitry comprises time to digital converter circuitry configured to measure and compare arrival times of said data value at the output of said first delay circuitry and said reference delay circuitry.

14. Monitoring circuitry as claimed in claim 1, wherein said comparison circuitry comprises phase detector circuitry configured to measure a difference in phase between the data value as received via the first delay path and the data value as received via the reference delay path.

15. Monitoring circuitry as claimed in claim 1, wherein said performance characteristic varies within a range from a fast region to a slow region in dependence on process variations during fabrication of the device affecting one or more physical properties of said components, and the output signal indicates whether said performance characteristic is within said fast region or said slow region.

16. Monitoring circuitry as claimed in claim 1, wherein said performance characteristic varies within a range including a fast region, a normal region and a slow region in dependence on process variations during fabrication of the device affecting one or more physical properties of said components, and said comparison circuitry comprises:

relative timing circuitry configured, if said first delay and said reference delay differ, to determine which of said first delay and said reference delay is longer;

normal condition detection circuitry configured to determine, if said first delay and said reference delay differ, whether the difference is within a predetermined acceptable range; and output generation circuitry configured to cause the output signal to indicate that said performance characteristic is within the normal region if the first delay and the reference delay do not differ, or differ within said predetermined acceptable range.

17. Monitoring circuitry as claimed in claim 16, wherein:

the output generation circuitry is configured to cause the output signal to indicate that said performance characteristic is within the fast region if the first delay and the reference delay differ by more than said predetermined acceptable region, and said reference delay is greater than said first delay; and the output generation circuitry is further configured to cause the output signal to indicate that said performance characteristic is within the slow region if the first delay and the reference delay differ by more than said predetermined acceptable region, and said reference delay is smaller than said first delay.

18. Monitoring circuitry as claimed in claim 3, wherein:

said components of the device include NMOS components and PMOS components;

each coupling element in said plurality of capacitor loading units being constructed such that the timing effect introduced into said reference delay path at least partially compensates for a timing variation introduced by variation in said performance characteristic amongst the NMOS components; and the monitoring circuitry further comprises further reference delay circuitry providing a further reference delay path, transmission of said data value over said further reference delay path incurring a further reference delay;

the further reference delay circuitry comprising a plurality of further capacitor loading units, each further capacitor loading unit being connected between an associated node of the further reference delay path and a further reference voltage in order to provide a capacitive loading on the further reference delay path;

wherein each further capacitor loading unit comprises a further capacitor element and a further coupling element connected in series between the further reference voltage and the associated node, the further coupling element being configured to control an amount of capacitance present at the associated node due to the further capacitor element, so as to introduce a timing effect into said further reference delay path that at least partially compensates for a timing variation introduced by variation in said performance characteristic amongst the PMOS components.

19. Monitoring circuitry as claimed in claim 18, further comprising:

switching circuitry configured, for each data value transmission, to selectively connect one of the reference delay circuitry and the further reference delay circuitry to the comparison circuitry, such that over a sequence of data value transmissions the comparison circuitry obtains comparison results sufficient to cause the output signal generated to provide output data indicative of the performance characteristic for both the NMOS components and the PMOS components.

20. A monitoring system for provision within a device to generate a result signal indicative of a performance characteristic of components of said device, the performance characteristic being dependent on one or more physical properties of said components, the monitoring system comprising:
plurality of instances of monitoring circuitry as claimed in claim 1, each instance configured to generate an associated output signal indicative of said performance characteristic; and
evaluation circuitry configured to receive the associated output signals from each of said plurality of instances of monitoring circuitry, and to generate said result signal in dependence on those associated output signals.

21. A monitoring system as claimed in claim 20, wherein the reference delay circuitry in each instance of monitoring circuitry is identically configured, and the evaluation circuitry is configured to perform an averaging operation in respect of the received associated output signals in order to generate said result signal.

22. A monitoring system as claimed in claim 20, wherein the reference delay circuitry in each instance of monitoring circuitry is identically configured, the plurality of instances of monitoring circuitry are distributed within said device, and the evaluation circuitry is configured to use the associated output signals from each of said plurality of instances of monitoring circuitry to determine across device variation in said performance characteristic.

23. A monitoring system as claimed in claim 20, wherein:
said components of the device include NMOS components and PMOS components;
the reference delay circuitry in at least one instance of monitoring circuitry is configured such that the associated output signal generated is indicative of the performance characteristic of the NMOS components;
the reference delay circuitry in at least one other instance of monitoring circuitry is configured such that the associated output signal generated is indicative of the performance characteristic of the PMOS components;
the evaluation circuitry is configured to combine the associated output signals from each of said plurality of instances of monitoring circuitry in order to generate as said result signal result data indicative of the performance characteristic for both NMOS components and PMOS components.

24. A memory device comprising:
a memory array configured to store data;
control circuitry configured to generate a number of control signals used to control access to the memory array;
at one instance of monitoring circuitry as claimed in claim 1, each instance configured to generate an output signal indicative of a performance characteristic of components of said memory device; and
the control circuitry being configured to adjust timing of at least one of said control signals in dependence on said output signal.

25. A method of monitoring within a device a performance characteristic of components of said device, the performance characteristic being dependent on one or more physical properties of said components, the method comprising:
transmitting a data value over a first delay path provided by first delay circuitry, transmission of said data value over said first delay path incurring a first delay that varies in dependence on said performance characteristic;
transmitting said data value over a reference delay path provided by reference delay circuitry, transmission of said data value over said reference delay path incurring a reference delay;
arranging the reference delay circuitry to contain components for adjusting the reference delay to be less sensitive than said first delay to variation in said performance characteristic, wherein adjusting the reference delay is self-compensating and includes providing capacitive loading on the reference delay path; and
generating an output signal in dependence on a comparison of the first delay and the reference delay, said output signal providing an indication of said performance characteristic,
wherein the reference delay circuitry comprises a plurality of resistor-capacitor blocks for providing said capacitive loading, each resistor-capacitor block comprising a resistor element within the reference delay path and an associated capacitor element coupled between the resistor element and a reference voltage.

26. Monitoring circuitry for provision within a device to generate an output signal indicative of a performance characteristic of components of said device, the performance characteristic being dependent on one or more physical properties of said components, the monitoring circuitry comprising:
first delay means for providing a first delay path means, transmission of a data value over said first delay path means incurring a first delay that varies in dependence on said performance characteristic;
reference delay means for providing a reference delay path means, transmission of said data value over said reference delay path means incurring a reference delay, the reference delay means comprising means for adjusting the reference delay to be less sensitive than said first delay to variation in said performance characteristic, wherein adjusting the reference delay is self-compensating and the means for adjusting includes providing capacitive loading on the reference delay path means; and
comparison means for generating said output signal in dependence on a comparison of the first delay and the reference delay,
wherein the reference delay means comprises a plurality of resistor-capacitor blocks for providing said capacitive loading, each resistor-capacitor block comprising a resistor element within the reference delay path means and an associated capacitor element coupled between the resistor element and a reference voltage.

* * * * *